United States Patent [19]
Nakanishi et al.

[11] Patent Number: 6,087,901
[45] Date of Patent: Jul. 11, 2000

[54] TUNING AMPLIFIER

[75] Inventors: Tsutomu Nakanishi, Tokyo; Akira Okamoto, Saitama, both of Japan

[73] Assignee: T.I.F. Co., Ltd, Tokyo, Japan

[21] Appl. No.: 09/142,311

[22] PCT Filed: Mar. 11, 1997

[86] PCT No.: PCT/JP97/00761

§ 371 Date: Sep. 3, 1998

§ 102(e) Date: Sep. 3, 1998

[87] PCT Pub. No.: WO97/34368

PCT Pub. Date: Sep. 18, 1997

[30] Foreign Application Priority Data

Mar. 12, 1996  [JP]  Japan ..................................... 8-083370
Apr. 15, 1996  [JP]  Japan ..................................... 8-117007

[51] Int. Cl.[7] .............................. H03F 3/191; H03G 3/18
[52] U.S. Cl. ............................................. 330/305; 330/137
[58] Field of Search .................................... 330/107, 109, 330/132, 137, 244, 302, 305, 306

[56] References Cited

U.S. PATENT DOCUMENTS 5,886,580  3/1999  Ikeda et al. ......................... 330/305 X

FOREIGN PATENT DOCUMENTS

| 46-27401 | 10/1967 | Japan . |
| 63-142906 | 6/1988 | Japan . |
| 7-59105 | 3/1995 | Japan . |
| 9-74318 | 3/1997 | Japan . |
| 95/31036 | 11/1995 | WIPO . |
| 95/34953 | 12/1995 | WIPO . |
| 96/04712 | 2/1996 | WIPO . |

*Primary Examiner*—Steven J. Mottola
*Attorney, Agent, or Firm*—Dellett and Walters

[57] ABSTRACT

A tuning amplifier 1 is provided with an oscillation circuit 10 incorporating an amplifier circuit 11 and a feedback circuit 12, an input circuit 14 which inputs signals to the oscillation circuit 10, and an automatic gain control (AGC) circuit 16 which controls the output amplitude of the oscillation circuit 10. When signals are inputted to the oscillation circuit 10 through the input circuit 14, such tuning that only signals having frequencies near the oscillation frequency of the oscillation circuit 10 are allowed to pass through is possible.

34 Claims, 24 Drawing Sheets

TUNING AMPLIFIER

TECHNICAL FIELD

The present invention relates to a tuning amplifier permitting only a pass of predetermined frequency components.

BACKGROUND ART

For use as a tuning circuit, various configurations using active elements and reactance elements have hitherto been proposed and put to practical use.

A conventional tuning circuit utilizing an LC resonance for example has a gain depending on an LC circuit, which gain may vary upon the regulation of a tuning frequency. Furthermore, typical tuning circuits extract predetermined frequency components from input signals, so that there may usually occur an attenuation of a signal amplitude with the gain resulting in 1 or less at the tuning frequency. For this reason, if amplification is required, a separate amplifier circuit must be connected thereto for amplifying the signal amplitude.

DISCLOSURE OF THE INVENTION

The present invention was conceived in order to solve such a problem. It is therefore the object of the present invention to provide a tuning amplifier ensuring a stabilized output amplitude and capable of amplifying a signal amplitude simultaneously with tuning.

A tuning amplifier in accordance with the present invention comprises an oscillation circuit for performing an oscillating action at a predetermined frequency, the oscillation circuit allowing its output to be fed back to its input side to form a closed loop; a gain control circuit for providing a control of an output amplitude of the oscillation circuit; and an input circuit for feeding signals to a part of the closed loop of the oscillation circuit. In case the oscillation circuit in its oscillation mode receives a signal having a frequency in the vicinity of the oscillation frequency, a phenomenon has been confirmed that the oscillation output is drawn into the frequency of the input signal, allowing a predetermined tuning action. Due to a regulation of the output amplitude effected by a gain control circuit in particular, there occurs no variation in gain even when the tuning frequency has been altered by varying the oscillation frequency of the oscillation circuit. A regulation of the response speed of the gain control circuit enables the oscillating action to be performed in response to various input AC signals such as an AM modulated signal and an FM modulated signal. It has also been confirmed that the above oscillating action is actually achieved when the output amplitude of the oscillation circuit is set to a value fairly smaller than that of the power source voltage, with the amplitude of the input AC signal being set to a value fairly smaller than this oscillation amplitude. If the input AC signal amplitude is taken as a criterion, a gain of several tens of decibels is achieved, allowing the amplification of the signal amplitude simultaneously with the oscillating action.

The tuning amplifier of the present invention employs a PLL configuration including the oscillation circuit in the form of a voltage controlled oscillation circuit, enabling the stability of the tuning frequency to be easily achieved. In particular, the above oscillation circuit performs a predetermined oscillating action in case of no input signals so that a PLL control can be provided irrespective of the presence of the input signals.

BEST MODE FOR CARRYING OUT THE INVENTION

An embodiment of the present invention will now be described in detail with reference to the accompanying drawings.

The present invention is characterized in that it allows an oscillation circuit to perform a feeble oscillation while simultaneously feeding a signal with a frequency close to the oscillation frequency into a part of the oscillation circuit to thereby allow a tuning action having a predetermined Q and gain.

Figure 1:
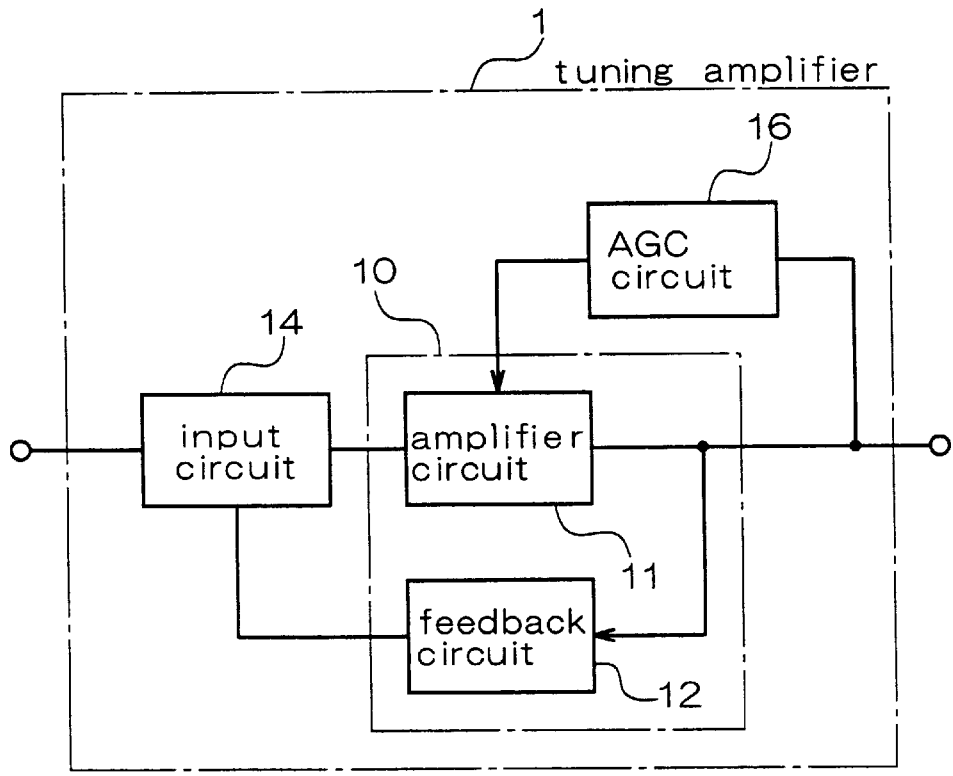
FIG. 1 is a diagram showing a configuration of an embodiment of a tuning amplifier.

FIG. 1 is a diagram showing a configuration of an embodiment of a tuning amplifier. The tuning amplifier 1 shown in the diagram comprises an oscillation circuit 10 including an amplifier circuit 11 and a feedback circuit 12, an input circuit 14 for feeding a signal into the oscillation circuit 10, and an automatic gain control (AGC) circuit 16 for providing a control of an output amplitude of the oscillation circuit 10.

The oscillation circuit 10 has a typical configuration of the oscillation circuit. The amplifier circuit 11 and the feedback circuit 12 form a closed loop. By imparting a frequency selective characteristic to either of the amplifier circuit 11 and the feedback circuit 12 or to the entirety thereof while controlling the gain of the amplifier circuit 11, an oscillating action is achieved at a predetermined frequency corresponding to the above frequency selective characteristic.

The oscillation circuit 10 is generally roughly divided into a phase-shift type, resonance type and other type of oscillation circuit. The phase-shift type oscillation circuit is subdivided into CR type, LR type and combination type oscillation circuit. The resonance type oscillation circuit includes Colpitts type, Hartley type and other various types.

The input circuit 14 serves to feed a signal to the closed loop formed by the amplifier circuit 11 and the feedback circuit 12. For example, by way of an impedance element having one end connected to a part of the closed loop, a signal is fed from the exterior of the oscillation circuit 10.

The AGC circuit 16 controls an output amplitude of the oscillation circuit 10 to be kept at a certain value. For example, the gain of the amplifier circuit 11 in the oscillation circuit 10 is controlled depending on the magnitude of the output amplitude so that control is provided to keep the output amplitude at a certain value.

Action of the thus configured tuning amplifier will now be described. In case of application of the tuning amplifier 1 shown in FIG. 1 to a receiver, a signal input via the input circuit 14 to the oscillation circuit 10 could be a variously modulated signal, e.g., an AM modulated or FM modulated signal.

Description is first made of a state in which no signal is provided as input via the input circuit 14. This state is equivalent to a state in which a part of the closed loop formed from the amplifier circuit 11 and the feedback circuit 12 in the oscillation circuit 10 is separated from the impedance element in the input circuit 14. Thus, the AGC circuit 16 is merely connected to the oscillation circuit 10, allowing a predetermined oscillating action. For example, the output amplitude of the oscillation circuit 10 is controlled to be several tens of percent or less of a power supply voltage.

Therefore, in case of application to an FM receiver for example, the tuning amplifier 1 issues a sine-wave signal having a predetermined frequency even when no FM wave is received (i.e., when no carrier wave exists), thus eliminating the necessity for a squelch circuit or a muting circuit. The same applies to the case of application to an AM receiver. Even when no AM wave is received, a sine-wave signal with a predetermined frequency is issued from the tuning amplifier 1, so that execution of an AM detection on this sine-wave signal results merely in acquisition of a predetermined DC component without causing any noises.

When in such a state that the oscillation circuit 10 stably oscillates at a predetermined frequency, a signal having a frequency close to the oscillation frequency is fed through the input circuit 14, the tuning amplifier 1 performs an oscillating action extracting only the components in the vicinity of the oscillation frequency from the input signal. It has also been confirmed that if the above oscillation frequency is coincident with the frequency of the input signal, even in the case of input of a signal with a small amplitude (e.g., of the order of $\frac{1}{10}$ of the oscillation output amplitude), there can be obtained a tuned output with an amplitude larger than the oscillation output amplitude. It is thus possible to perform an amplification of the order of several tens of decibels simultaneously with tuning.

Furthermore, by varying a ratio between the amplitude of the oscillation output of the oscillation circuit 10 controlled by the AGC circuit 16 and the amplitude of an input signal or by altering a point to feed the input signal, it is possible to vary the Q, that is, a passband width of the tuning amplifier 1. Alternatively, instead of altering the above signal amplitude ratio, an element constant of the impedance element in the input circuit 14 may be varied.

The oscillation circuit 10 employs an oscillation frequency variable configuration so that a tuning frequency variable type tuning amplifier 1 can easily be configured. At that time, by virtue of the AGC circuit 16 connected to the oscillation circuit 10 for keeping the oscillation amplitude at a certain value, a stable gain can be obtained upon the tuning without suffering any inconveniences e.g., that the gain of the tuning amplifier 1 may sharply change when the frequency is varied.

In case the input signal is an AM modulated signal, there is a need to fetch as a tuning output a carrier wave of e.g., a voice with a predetermined frequency having overlaid AM modulation components. Accordingly, a response speed of the AGC circuit must be regulated so as to ensure that the AGC circuit 16 can suppress a variation in amplitude having a frequency less than that of the AM modulation components.

Figure 2:
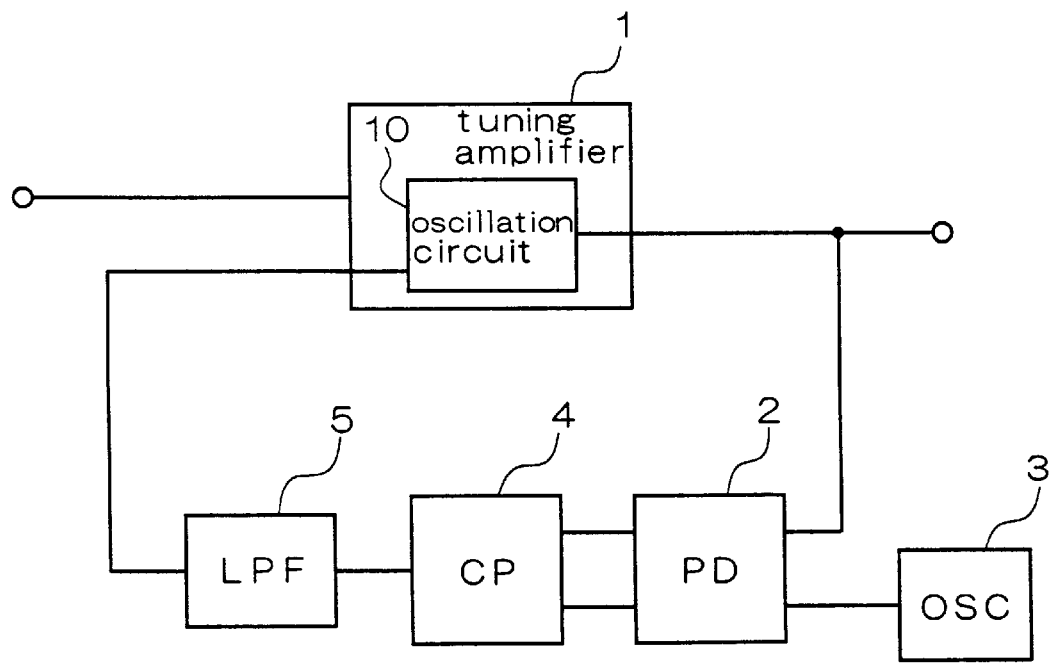
FIG. 2 is a diagram showing a configuration to PLL control the tuning amplifier in FIG. 1.

FIG. 2 is a diagram showing a PLL (phase lock loop) configuration including the tuning amplifier 1 shown in FIG. 1. The oscillation circuit 10 in the tuning amplifier 1 shown in FIG. 1 is comprised of a voltage-controlled oscillator capable of varying the oscillation frequency in response to an externally applied control voltage, whereby the tuning amplifier 1 can easily be PLL controlled. More specifically, a PLL configuration is employed which includes the oscillation circuit 10 in the tuning amplifier 1, a phase comparator (PD) 2, a charge pump (CP) 4 and a low pass filter (LPF) 5, thereby easily allowing the tuning output frequency of the tuning amplifier 1 to coincide with the oscillation frequency of an oscillator (OSC) 3.

The tuning amplifier 1 performs its oscillating action by making use of the oscillating action of the oscillation circuit 10 in this manner, with the result that this oscillation output can be utilized to provide a PLL control even in the absence of input signals.

[First Configuration Example of Tuning amplifier]

Description will then be made of a detailed configuration of the tuning amplifier 1 in case of using a phase-shift type oscillation circuit 10.

Figure 3:
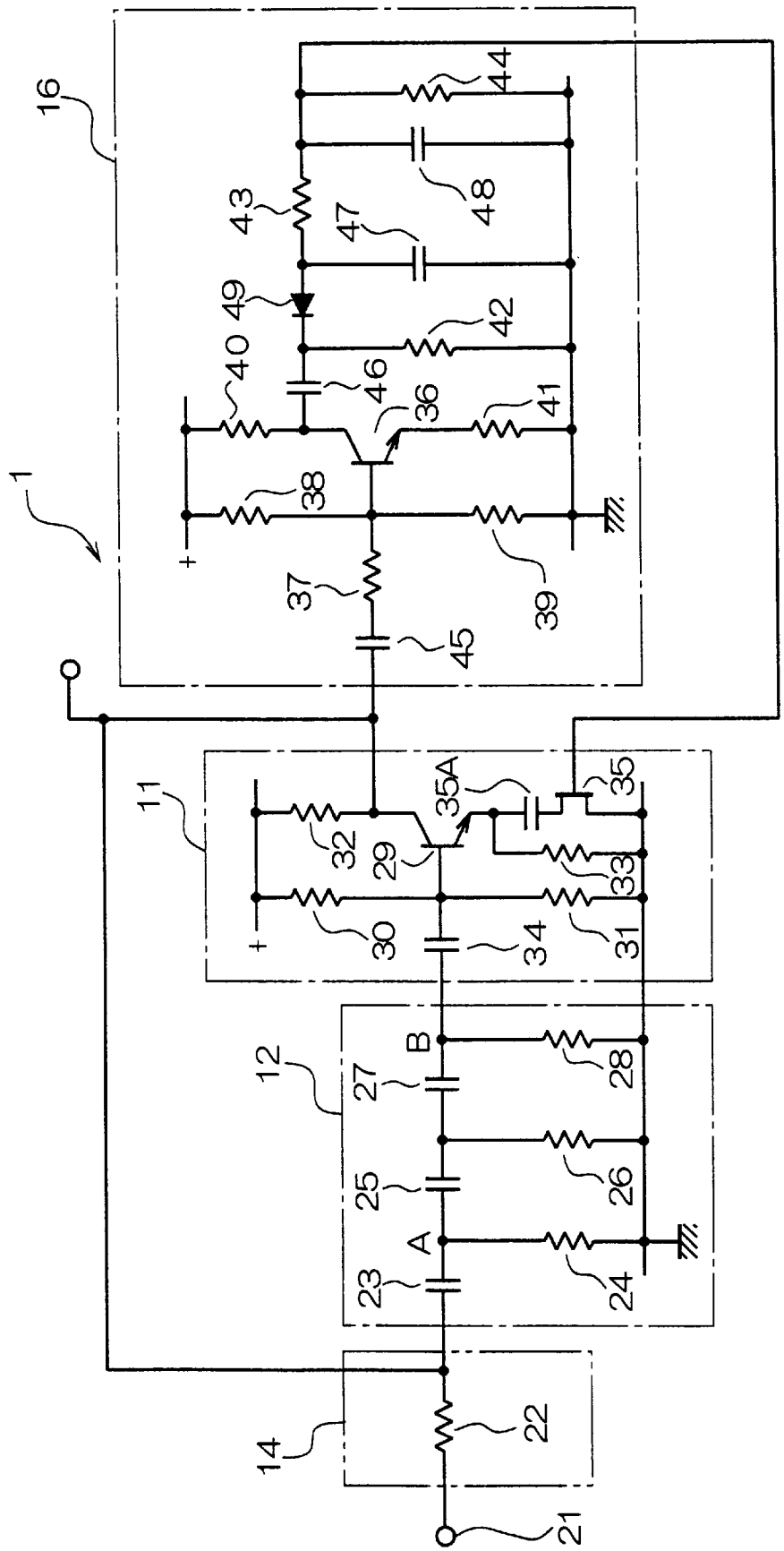
FIG. 3 is a circuit diagram showing a first configuration example of the tuning amplifier using the phase-shift type oscillation circuit.

FIG. 3 is a circuit diagram showing a first configuration example of the tuning amplifier 1 using the phase-shift type oscillation circuit. The input circuit 14 within the tuning amplifier 1 shown in the diagram includes an input resistor 22 having one end connected to an input terminal 21. The input terminal 21 receives a signal in the form of a modulated carrier wave. The feedback circuit 12 includes three cascaded high pass filters, that is, a high pass filter consisting of a capacitor 23 and a resistor 24, a high pass filter consisting of a capacitor 25 and a resistor 26, a high pass filter consisting of a capacitor 27 and a resistor 28.

The amplifier circuit 11 on the other hand includes a transistor 29, resistors 30 to 33, a capacitor 34 and a variable resistor 35. A base terminal of the transistor 29 is connected via the capacitor 34 for blocking a direct current to an output terminal of the feedback circuit 12 and is connected to one ends of the resistors 30 and 31. These resistors 30 and 31 are provided for applying a bias to the transistor 29. The resistor 32 is disposed between a collector terminal of the transistor 29 and a positive power source, with the resistor 33 and the variable resistor 35 being disposed between an emitter terminal and a ground terminal. The resistance value of the variable resistor 35 is variable by a control voltage output from the AGC circuit 16. Description is made hereinbelow of a case where the variable resistor 35 is comprised of a p-channel type FET.

It is to be noted that a capacitor 35A connected in series to the variable resistor 35 serves to block a direct current, thus making it possible to change the gain of the amplifier circuit 11 without varying an operating point of the transistor 29 when the resistance value of the variable resistor 35 has been varied.

The AGC circuit 16 includes a transistor 36, resistors 37 to 44, capacitors 45 to 48, and a diode 49. A base terminal of the transistor 36 is connected via the capacitor 45 and the resistor 37 to an output terminal of the amplifier circuit 11 and is connected to one ends of the resistors 38 and 39. These resistors 38 and 39 are provided for applying a bias to the transistor 36. The resistor 40 is interposed between a collector terminal of the transistor 36 and a positive power source, with the resistor 41 being interposed between an emitter terminal and a ground terminal.

Action of the tuning amplifier 1 shown in FIG. 3 will hereinafter be described. Let Vi be an input voltage at the feedback circuit 12, Vo an output voltage, C a capacitance of the capacitors 23, 25 and 27, and R a resistance value of the resistors 24, 26 and 28. Then, a relationship is given as $$Vo = Vi \cdot (\omega CR)^3 / [(\omega CR)^3 - 5\omega CR - j\{6(\omega CR)^2 - 1\}] \quad (1)$$

When the imaginary part of the expression (1) is null, the phase-shift amount of the feedback circuit 12 results in 180°. The frequency of the input signal in this case is given as $$f = 1/2\pi\sqrt{(6CR)} \quad (2)$$

The amplifier circuit 11 shown in FIG. 3 is of an emitter grounded configuration, so that the direction of a change in the voltage at the base terminal of the transistor 29 is opposite to the direction of a change in the voltage at the collector terminal. That is, the phase-shift amount of the amplifier circuit 11 is 180°, with the result that the total phase-shift amount of the feedback circuit 12 and the amplifier circuit 11 becomes equal to 360° at a predetermined frequency. Furthermore, the output of the amplifier circuit 11 is fed back to the input side of the feedback circuit 12 so that the tuning amplifier 1 of FIG. 3 oscillates in a stabilized manner as long as the combined gain of the feedback circuit 12 and the amplifier circuit 11 is equal to 1.

Although three high pass filters are cascaded in FIG. 3, the number of high pass filters to be cascaded may naturally be more than three.

Once the feedback circuit 12 receives a signal having a frequency given by the expression (2), the output voltage Vo at the feedback circuit 12 attenuates to about 1/29 as apparent from expression (3).

$$Vo = Vi \times (1/\sqrt{6})^3 / \{(1/\sqrt{6})^3 - 5/\sqrt{6}\} \approx -0.0344\, Vi \approx -1/29 \quad (3)$$

For this reason, if the amplifier circuit 11 has a 29 times voltage gain, the entire gain of the tuning amplifier 1 becomes equal to 1, allowing a stable oscillation even though no signal is fed via the input circuit 14. If, when the tuning amplifier 1 oscillates at a predetermined frequency, a signal having a frequency close to the oscillation frequency is fed via the input circuit 14, then the tuning amplifier 1 performs an oscillating action extracting only the components in the vicinity of the oscillation frequency.

On the contrary, the output from the amplifier circuit 11 is fed to the base terminal of the transistor 36 by way of the DC blocking capacitor 45 and the resistor 37 within the AGC circuit 16. Accordingly, only the AC components of the output from the amplifier circuit 11 are amplified by the transistor 36. This amplified output is rectified by the diode 49 and then passed through a smoothing circuit consisting of the capacitors 47 and 48 and the resistor 43, thus obtaining a predetermined control voltage. By virtue of such an action of the AGC circuit 16, if the output amplitude of the amplifier circuit 11 becomes larger, the control voltage is boosted to heighten the resistance value of the variable resistor 35 comprised of a p-channel type FET to lessen the output amplitude of the amplifier circuit 11, whereas if the output amplitude of the amplifier circuit 11 becomes smaller, the control voltage is reduced to lower the resistance value of the variable resistor 35 to enlarge the output amplitude of the amplifier circuit 11, thereby keeping the output amplitude of the amplifier circuit 11 at substantially a constant level.

Description will then be made of the result of experiments on the circuit of FIG. 3 which has actually been put together. It is to be noted that the experimental result set forth hereinbelow was obtained by use of the tuning amplifier 1 allowing the oscillation circuit 10 to oscillate at a predetermined amplitude without providing an amplitude control by the AGC circuit 16.

When a self-oscillation output from the tuning amplifier 1 has an amplitude of about 900 mV in the absence of a signal fed to the input circuit 14, the input terminal 21 received an AC signal having an amplitude of 75 mV and the same frequency as the self-oscillation frequency. As a result of this, the output amplitude of the tuning amplifier 1 was of the order of 3 Vpp. Accordingly, the gain in this case resulted in about 32 dB as given by expression (4). It has proved that a sufficient gain was obtained. Note that the power source voltage was 9V.

$$\text{GAIN}=20\times\log(3/0.075)=20\times1.602=32.04 \quad (4)$$

Figure 4:
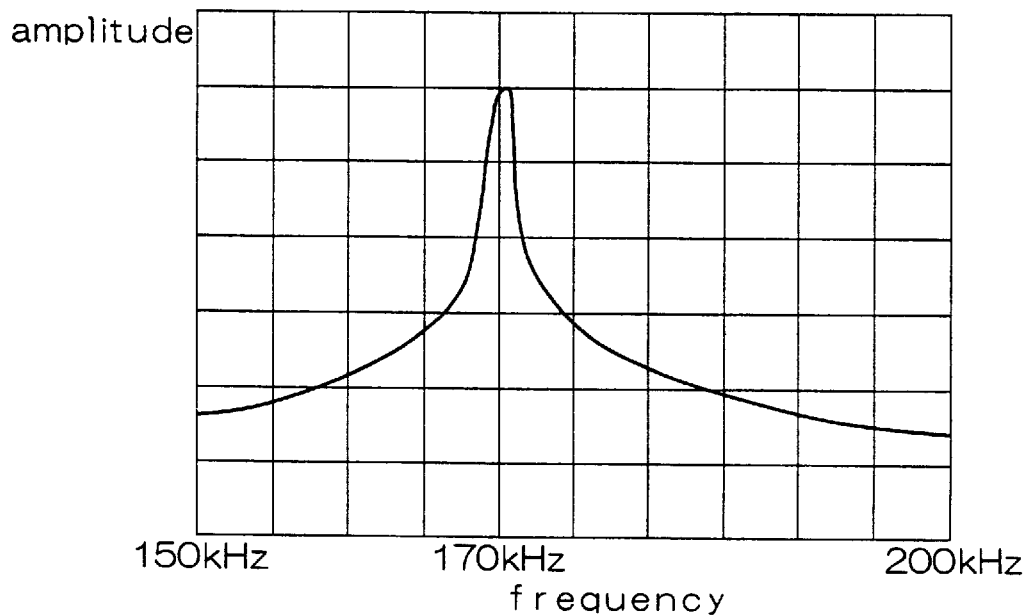
FIG. 4 is a diagram showing the result of measurement of a tuning characteristic of the tuning amplifier in FIG. 3.

FIG. 4 is a diagram showing the result of measurement of a tuning characteristic of the tuning amplifier 1 illustrated in FIG. 3. The axis of abscissas represents frequencies of the input signal and the axis of ordinates represents amplitudes of the oscillation output. As can be seen from FIG. 4, the tuning amplifier 1 has a tuning characteristic having as a peak the same frequency component as the self-oscillation frequency.

Figure 5:
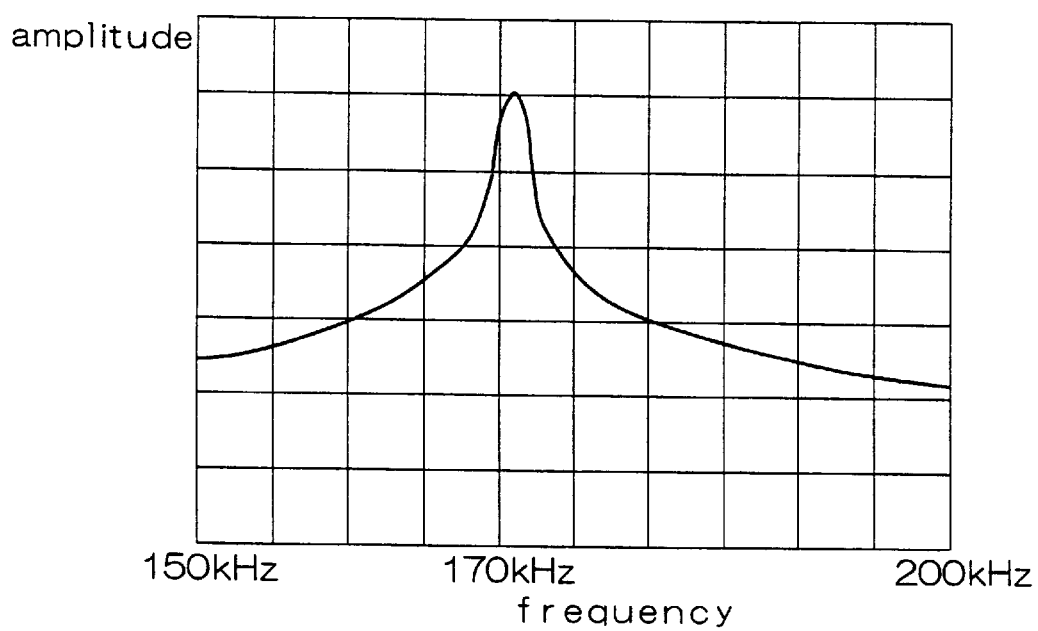
FIG. 5 is a diagram showing a tuning characteristic obtained when the input circuit has been connected to connection point A of FIG. 3.
Figure 6:
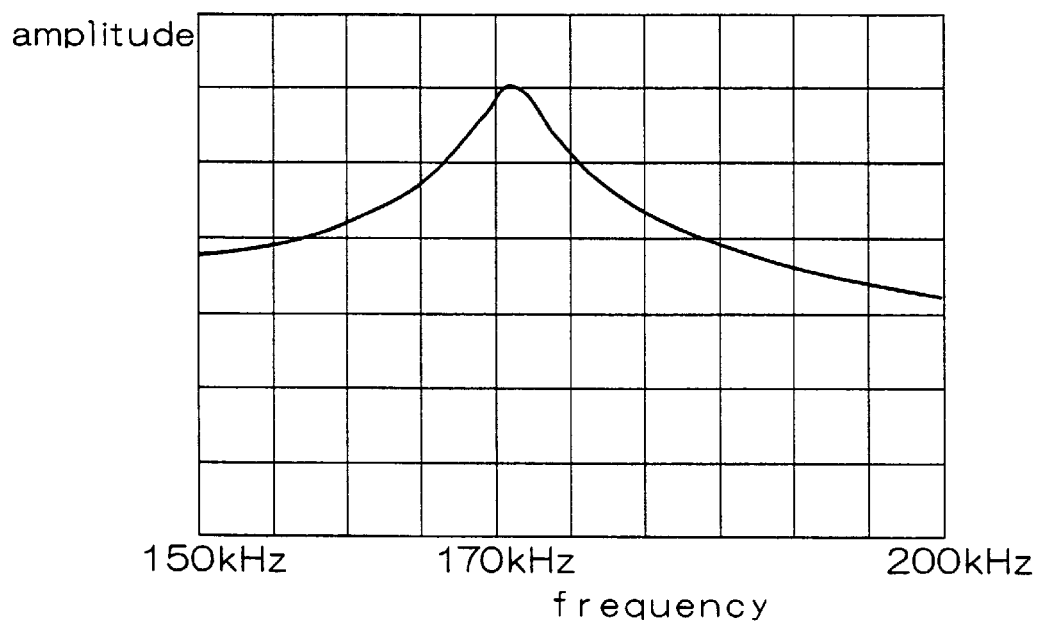
FIG. 6 is a diagram showing a tuning characteristic obtained when the input circuit has been connected to the connection point B of FIG. 3.

On the other hand, FIGS. 5 and 6 are diagrams showing tuning characteristics obtained when altering a point to connect the input circuit 14. More specifically, FIGS. 5 and 6 respectively illustrate the tuning characteristics obtained when the input circuit 14 has been connected to connection points A and B of FIG. 3. As is apparent from the FIGS. 5 and 6, a variation in the value of Q is caused by a change of the point to connect the input circuit 14, in other words, by a change of the point to feed a signal. Accordingly as the point to feed the input signal comes away from the amplifier circuit 11, the value of Q becomes larger.

A switch or the like may therefore be provided so as to allow the connection point of the input circuit 14 to be arbitrarily changeable. Thus, if an improvement in selectivity of the received frequency is desired in case of using the tuning amplifier 1 as a receiver, for example, if adjacent frequencies include frequency signals from other stations, the value of Q may be increased so that the selectivity can easily be improved. On the contrary, if the adjacent frequencies include no frequency signals from other stations, the value of Q may be diminished so that the reproducibility can easily be improved.

It is to be appreciated that the value of Q may be varied by changing the resistance value of the input resistor 22 instead of changing the input signal feeding point. Therefore, the input resistor 22 may be replaced by a variable resistor capable of change of the resistance value so as to ensure an easier regulation of the value of Q than the case of change of the input signal feeding point. Alternatively, the value of Q could be regulated by varying a ratio between the input signal amplitude and the output amplitude of the amplifier circuit 11 controlled by the AGC circuit 16.

Figure 7:
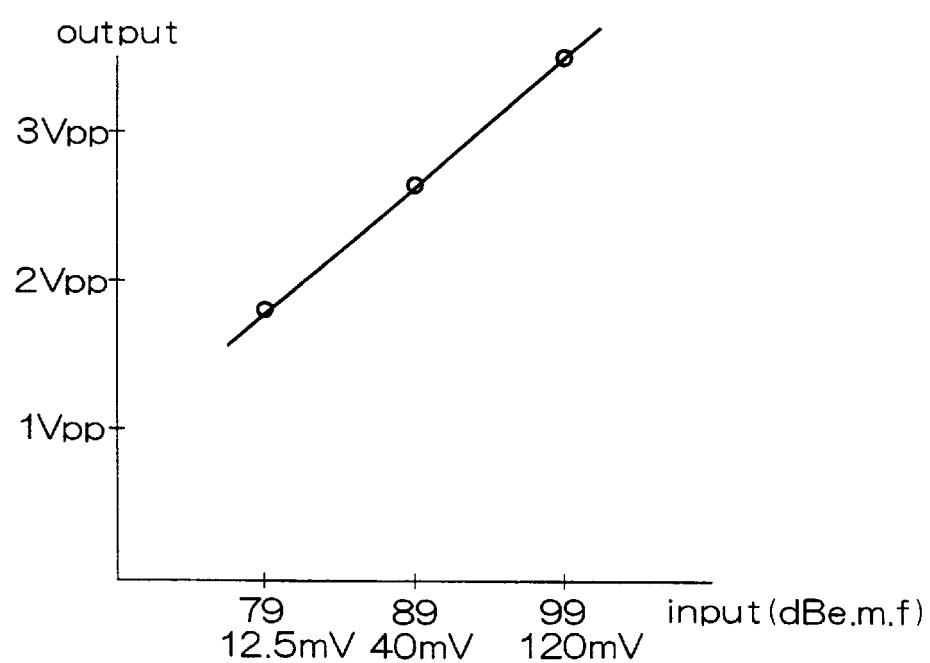
FIG. 7 is a diagram showing a manner of variation in the output amplitude in case of input to the input circuit of a signal having the same frequency as the self-oscillation frequency of the tuning amplifier but having a different amplitude.

FIG. 7 is a diagram showing a manner of variation in the output amplitude in case of input to the input circuit 14 of a signal having the same frequency as the self-oscillation frequency of the tuning amplifier 1 but having a different amplitude. As shown in the diagram, a variation in the amplitude of the signal input to the input circuit 14 results in a substantially linear variation of the output amplitude (unit: dB) of the tuning amplifier 1. Thus, according to the tuning amplifier 1 of this embodiment, it is possible to faithfully fetch a variation in amplitude arising from AM modulation, etc., contained in the carrier wave components.

[Second Configuration Example of Tuning amplifier]

Figure 8:
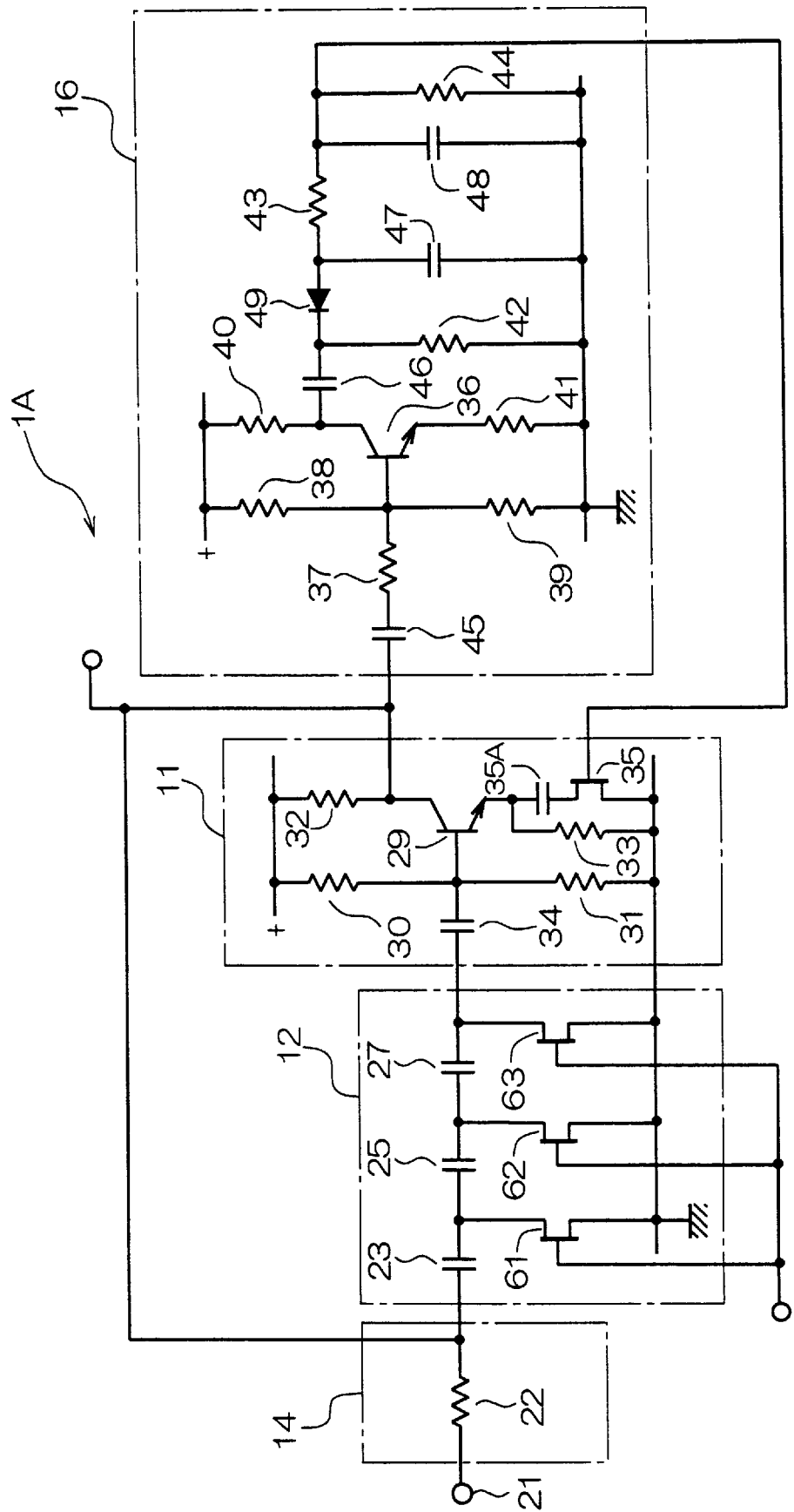
FIG. 8 is a diagram showing a detailed configuration of the tuning amplifier employing the PLL configuration.

The tuning amplifier 1 shown in FIG. 3 is not configured on the assumption that it employs a PLL configuration, although it may employ the PLL configuration as shown in FIG. 2. FIG. 8 is a diagram showing a detailed configuration of the tuning amplifier employing the PLL configuration. The tuning amplifier generally designated at 1A in the diagram differs from the tuning amplifier 1 shown in FIG. 3 only in that the resistors 24, 26 and 28 within the feedback circuit 12 are replaced by variable resistors 61, 62 and 63, respectively. Resistance values of these variable resistors 61 to 63 are varied in response to the output from the low pass filter 5 shown in FIG. 2, whereby a control is provided such that the frequency of the oscillation output of the tuning amplifier 1A is coincident with the oscillation frequency of the oscillator 3 shown in FIG. 2.

[Third Configuration Example of Tuning amplifier]

Figure 9:
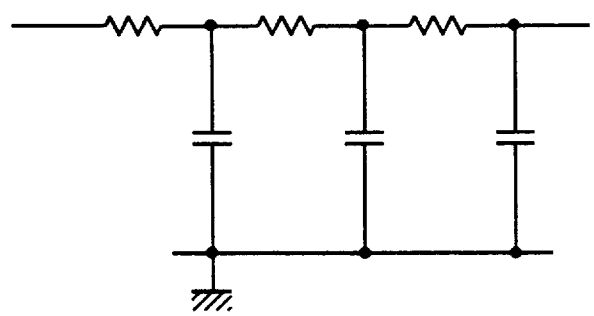
FIG. 9 is a diagram showing an example in which the feedback circuit includes three cascaded low pass filters.

Although the feedback circuit 12 shown in FIG. 3 includes three cascaded high pass filters, the high pass filters may be replaced by low pass filters in cascade connection. FIG. 9 illustrates an example in which the feedback circuit 12 includes three cascaded low pass filters each consisting of a resistor and a capacitor. In contrast with the high pass filter, the low pass filter has a nature delaying the phase, so that the phase-shift amount of the entire feedback circuit 12 becomes equal to 180° at a predetermined frequency. It is therefore possible to obtain the same frequency selective characteristic as the case of the cascade connection of the high pass filters.

Figure 10:
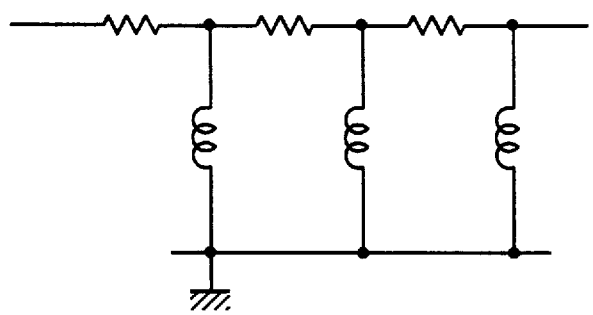
FIG. 10 is a diagram showing an example of three cascaded high pass filters each consisting of a resistor and an inductor.
Figure 11:
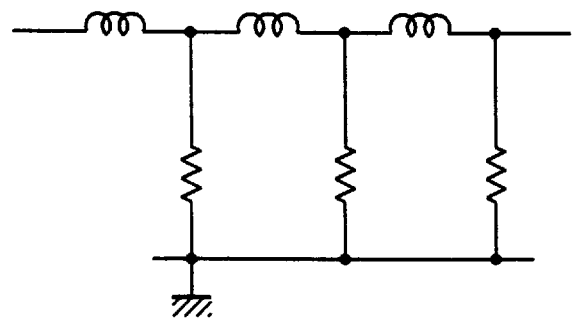
FIG. 11 is a diagram showing an example of three cascaded low pass filters each consisting of a resistor and an inductor.

On the other hand, FIG. 10 illustrates an example of three cascaded high pass filters each consisting of a resistor and an inductor, and FIG. 11 illustrates an example of three cascaded low pass filters each consisting of a resistor and an inductor. Although they have different phase shifting directions from each other, the two examples are the same in that the phase-shift amount of the entire feedback circuit 12 becomes equal to 180° when the input signal frequency is equal to the predetermined frequency, thus allowing a replacement of the feedback circuit 12 shown in FIG. 3 therewith.

It is to be noted that in case of the replacement the number of cascaded high pass filters or low pass filters is not limited to three. In case the entire feedback circuit 12 including the inductors is formed on the semiconductor substrate, the inductance of each inductor is extremely reduced, with the result that the oscillation frequency of the oscillation circuit 10, namely, the tuning frequency of the tuning amplifier 1 goes very high. In such a case, it is preferred that the input circuit 14 of FIG. 3 be formed from an inductor in place of the input resistor 22.

In case no amplitude control is provided by the AGC circuit 16, beats may occur if there is a slight different between the self-oscillation frequency and the input signal frequency. The occurrence of such beats can be prevented by the provision of amplitude control by the AGC circuit 16.

[Fourth Configuration Example of Tuning amplifier]

Figure 12:
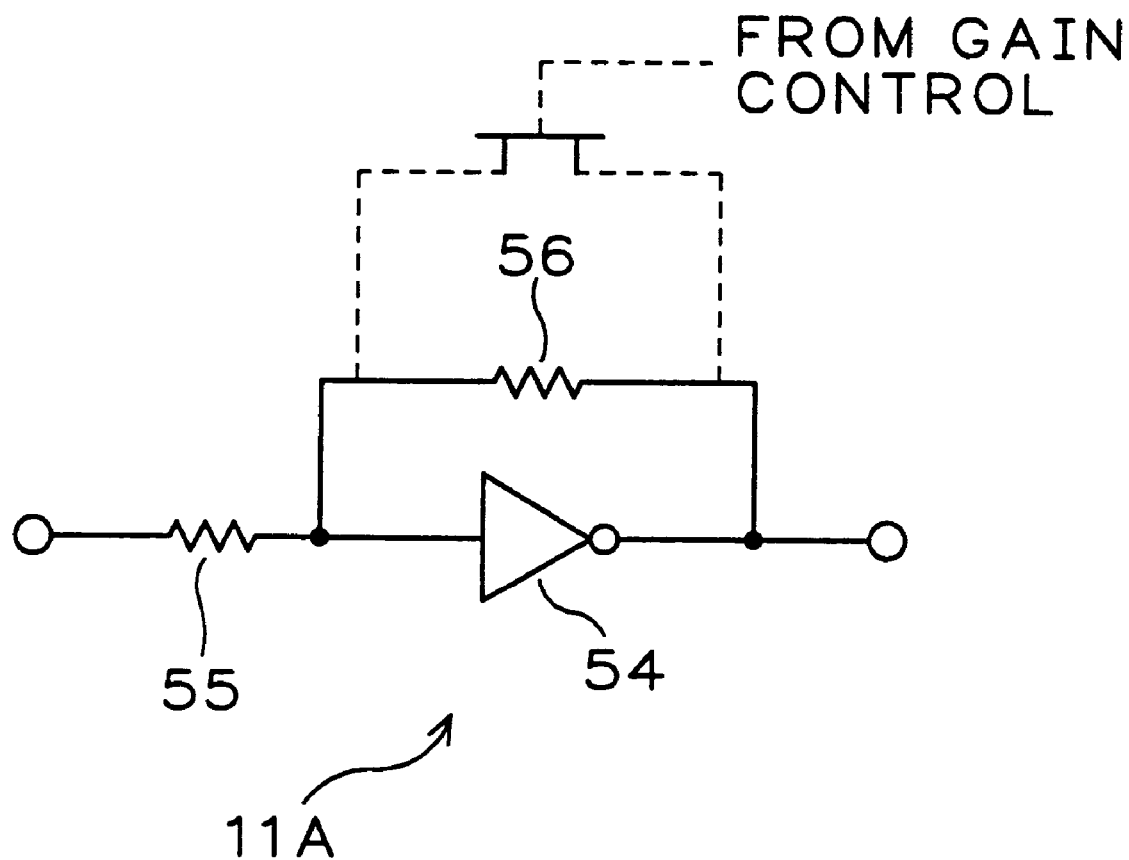
FIG. 12 is a diagram showing a detailed configuration of an amplifier circuit capable of replacing the amplifier circuit shown in FIG. 3.

FIG. 12 is a diagram showing a detailed configuration of an amplifier circuit 11A capable of replacing the amplifier circuit 11 shown in FIG. 3. The amplifier circuit 11A shown in the diagram includes a CMOS inverter 54 and resistors 55 and 56. The CMOS inverter 54 acts as an analog amplifier by connecting its input and output via the resistor 56. The gain at that time is determined depending on a ratio of the resistance between the resistors 55 and 56. Let R55 and R56 be resistance values of the resistors 55 and 56, respectively, then the gain of the amplifier circuit 11A is expressed as R56/R55. Thus, for example, by connecting the variable resistor 35 shown in FIG. 3 in parallel to the resistor 55 or 56 to regulate the resistance value in response to the output of the AGC circuit 16, it is possible to suppress a variation in amplitude of the oscillation output in the same manner as the case of the tuning amplifier 1 shown in FIG. 3. An example of such connection of variable resistor 35 is illustrated in phantom in FIG. 12.

In case of using the amplifier circuit 11A shown in FIG. 12 to constitute the tuning amplifier 1 in this manner, a CMOS process based fabrication becomes possible, achieving a simplification of manufacturing processes as well as a reduction in costs.

[First Variant of Oscillation Circuit]

Figure 13:
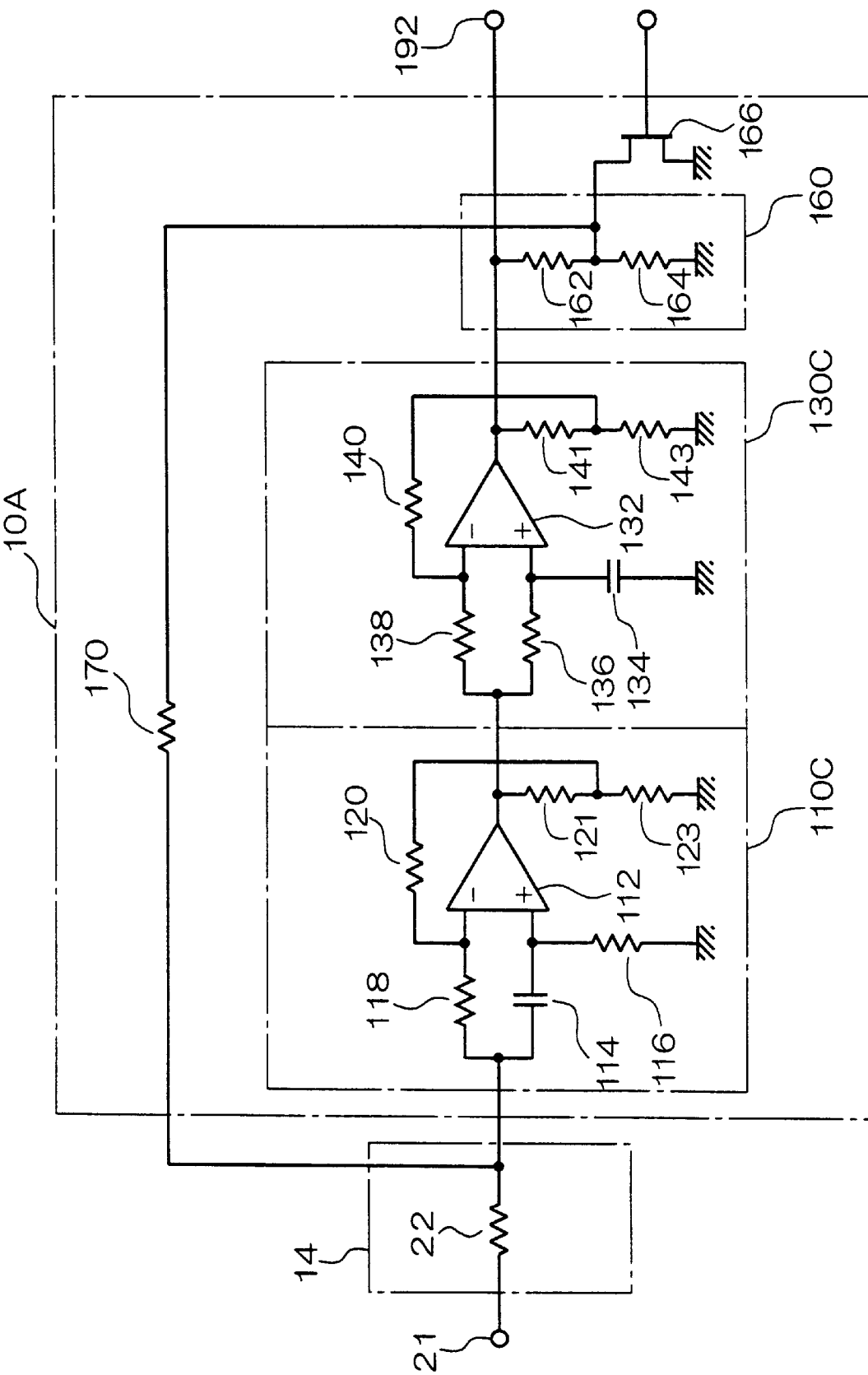
FIG. 13 is a circuit diagram showing a first variant of the oscillation circuit.

FIG. 13 is a circuit diagram showing a first variant of the oscillation circuit. The oscillation circuit generally designated at 10A in the diagram comprises two phase shifting circuits 110C and 130C, at voltage dividing circuit 160 and a feedback resistor 170. The phase shifting circuits 110C and 130C serve to allow the phase of an input AC signal to shift by a predetermined amount. The combined phase-shift amount of the two phase shifting circuits 110C and 130C are set to 360° at a predetermined frequency. The voltage dividing circuit 160 is disposed on the output side of the posterior phase shifting circuit 130C and consists of resistors 162 and 164.

The anterior phase shifting circuit 110C includes a capacitor 114 and resistors 116, 118, 120, 121 and 123. An inverting input terminal of an operational amplifier 112 receives an AC signal byway of the resistor 118, while a non-inverting input terminal of the operational amplifier 112 connects with a CR circuit consisting of a capacitor 114 and a resistor 116. An output terminal of the operational amplifier 112 is associated with a voltage dividing circuit consisting of the resistors 121 and 123. The resistor 120 is interposed between a divided voltage output terminal of the voltage dividing circuit and the inverting input terminal of the operational amplifier 112. The resistor 118 and the resistor 120 are set to have the same resistance value.

A transfer function K1 of the anterior phase shifting circuit 110C having such a configuration is given as $$K1 = -a_1(1-T_1 s)/(1+T_1 s) \quad (5)$$

where $T_1$ is a time constant of the CR circuit consisting of the resistor 116 and the capacitor 114, $s = j\omega$, and $a_1$ is a gain of the phase shifting circuit 110C expressed as $a_1 = (1+R21/R23) > 1$. Note that R21 and R23 are resistance values of the resistors 121 and 123, respectively.

As is apparent from the expression (5), the phase shifting circuit 110C is an full band pass circuit, so that the output amplitude of its output voltage Eo is constant irrespective of the frequency, allowing the phase-shift amount Ø1 to vary from 180° to 360° in response to the frequency of the input signal. The phase shifting circuit 110C is capable of providing a gain larger than 1 by regulating the resistance values R21 and R23.

On the other hand, the posterior phase shifting circuit 130C shown in FIG. 13 includes an operational amplifier 132, a CR circuit consisting of a capacitor 134 and a resistor 136, a voltage dividing circuit consisting of resistors 141 and 143, a resistor 138 and a resistor 140.

The circuit elements constituting the phase shifting circuit 130C are connected in the same manner as the phase shifting circuit 110C except that a way of connection of the capacitor 134 and the resistor 136 is opposite to the case of the phase shifting circuit 110C, with the resistors 138 and 140 being set to have the same resistance values.

A transfer function K2 of the posterior phase shifting circuit 130C having such a configuration is given as $$K2 = a_2(1-T_2 s)/(1+T_2 s) \quad (6)$$

where T2 is a time constant of the CR circuit consisting of the capacitor 134 and the resistor 136, $s = j\omega$, and $a_2$ is a gain of the phase shifting circuit 130C expressed as $a_2 = (1+R41/R43) > 1$. Note that R41 and R43 are resistance values of the resistors 141 and 143, respectively.

As is apparent from the expression (6), the phase shifting circuit 130C is an full band pass circuit, so that the output amplitude of its output voltage Eo is constant irrespective of the frequency, allowing the phase-shift amount Ø2 to vary from 0° to 180° in response to the frequency of the input signal. The phase shifting circuit 130C is capable of providing a gain larger than 1 by regulating the resistance values R41 and R43.

In this manner, the phase is shifted by a predetermined amount in both the phase shifting circuits 110C and 130C, with the result that the combined phase-shift amount of the two phase shifting circuits 110C and 130C becomes equal to 360° at a predetermined frequency. Thus, by setting to 1 or more the loop gain of the closed loop including the two phase shifting circuits 110C and 130C, the oscillation circuit 10A is allowed to oscillate at this predetermined frequency.

The posterior phase shifting circuit 130C is followed by the voltage dividing circuit 160, with a variable resistor 166 being connected in parallel to the resistor 164 constituting the voltage dividing circuit 160. The variable resistor 166 is formed from for example a channel resistor of a p-channel type FET. A gate terminal of this FET is associated with the output terminal of the AGC circuit 16 shown in FIG. 3. Thus, for example, when the output amplitude of the oscillation circuit 10A shown in FIG. 13 becomes larger, the control voltage output from the AGC circuit 16 shown in FIG. 3 is built up, allowing the gate voltage at the FET to increase. For this reason, the resistance value of the variable resistor 166 increases so that control is provided so as to reduce the output amplitude of the oscillation circuit 10A.

On the contrary, when the output amplitude of the oscillation circuit 10A becomes smaller, the control voltage output from the AGC circuit 16 lowers and the resistance value of the variable resistor 166 diminishes, with the result that control is provided so as to enlarge the output amplitude of the oscillation circuit 10A. By virtue of such control, the output amplitude of the oscillation circuit 10A is at all times kept at a certain value.

In this manner, the oscillation circuit 10A shown in FIG. 13 uses as a feedback signal a signal attenuated via the voltage dividing circuit 160 and fetches as an output from the oscillation circuit 10A a signal previous to the input to the voltage dividing circuit 160, whereby it is possible to perform an oscillating action extracting only a predetermined frequency component from among the input signals and to perform a predetermined amplifying action on the thus extracted signal. In addition, due to the fact that the voltage dividing ratio of the voltage dividing circuit 160 is varied in response to the output from the AGC circuit 16 shown in FIG. 3, the oscillation circuit can have substantially a constant output amplitude. Furthermore, the oscillation circuit 10A is formed from a combination of the operational amplifiers, the capacitors and resistors in order that all the constituent elements can be formed on the substrate.

Although the resistance values of the feedback resistor 170 and of the input resistor 22 within the input circuit 14 are fixed in FIG. 13, at least one of them may be replaced by a variable resistor so as to allow an alteration of the ratio of resistance between the feedback resistor 170 and the input resistor 22. This makes it possible to regulate Q of the tuning amplifier 1.

Furthermore, the resistor 116 and/or the resistor 136 may be replaced by a variable resistor so as to allow an alteration of the time constant of the CR circuit within the phase shifting circuit 110C or 130C. A continuous alteration of the resistance value of the resistor 116 and/or the resistor 136 will enable the oscillation frequency to continuously change.

It is to be appreciated that upon the cascade connection of the phase shifting circuits 110C and 130C, either of the voltage dividing circuits connected to the output terminals of the operational amplifiers 112 and 132 in the respective phase shifting circuits may be excluded or alternatively the voltage dividing ratio may be set to 1.

Although the oscillation circuit 10A shown in FIG. 13 alters a voltage dividing ratio of the voltage dividing circuit 160 in response to the control voltage output from the A(;C circuit 16, there may be altered in response to the control voltage from the AGC circuit 16 the voltage dividing ratio of the voltage dividing circuit in the phase shifting circuit 110C and/or the voltage dividing ratio of the voltage diving circuit in the phase shifting circuit 130C. In this case, the voltage dividing circuit 160 posterior to the phase shifting circuit 130C may be excluded such that the output from the phase shifting circuit 130C is fed directly back to the anterior stage side. Alternatively, the voltage dividing ratio may be set to 1 with the resistance value of the resistor 162 in the voltage dividing circuit 160 being set to an extremely small value.

In the case of the oscillation circuit 10A shown in FIG. 13, an input signal is fed to the input circuit 14 disposed in front of the anterior phase shifting circuit 110C, although the point to feed the input signal is not limited to the front side of the anterior phase shifting circuit 110C, but instead the input signal may be fed for example to the input circuit 14 interposed between the phase shifting circuit 110C and the phase shifting circuit 130C.

[Second Variant of Oscillation Circuit]

Although the oscillation circuit 10A shown in FIG. 13 comprises the phase shifting circuits each including a CR circuit therewithin, the oscillation circuit may comprise a phase shifting circuit including an LR circuit in place of the CR circuit.

Figure 14:
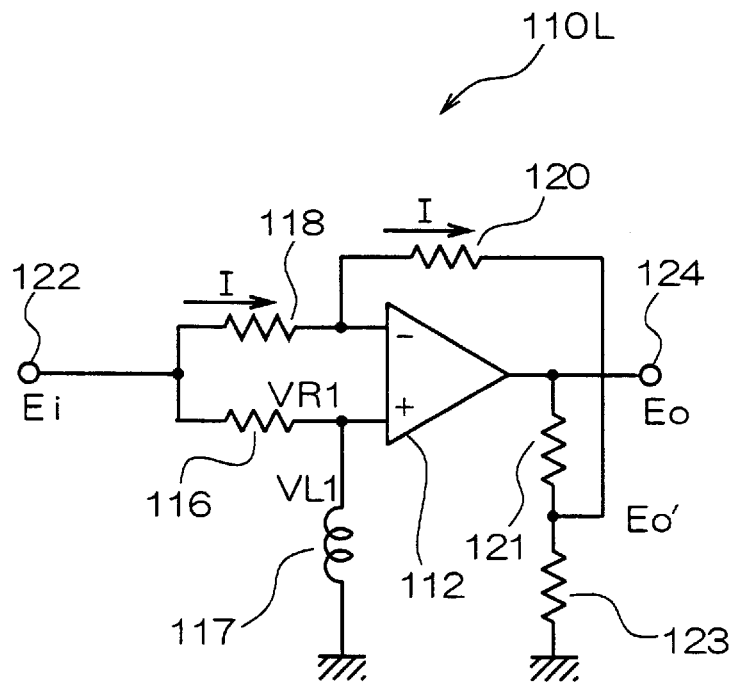
FIG. 14 is a circuit diagram showing a configuration of the phase shifting circuit which includes the LR circuit and which is a variant of a phase shifting circuit in FIG. 13.

FIG. 14 is a circuit diagram showing a configuration of the phase shifting circuit which includes the LR circuit and which is replaceable with the anterior phase shifting circuit 110C of the oscillation circuit 10A shown in FIG. 13. The phase shifting circuit designated at 110L in the diagram includes an LR circuit consisting of a resistor 116 and an inductor 117, in lieu of the CR circuit consisting of the capacitor 114 and the resistor 116 within the anterior phase shifting circuit 110C shown in FIG. 13. The other configurations are substantially the same as those of the phase shifting circuit 110C. The phase shifting circuit 110L has a transfer function and phase-shift amount identical to those of the phase shifting circuit 110C.

Figure 15:
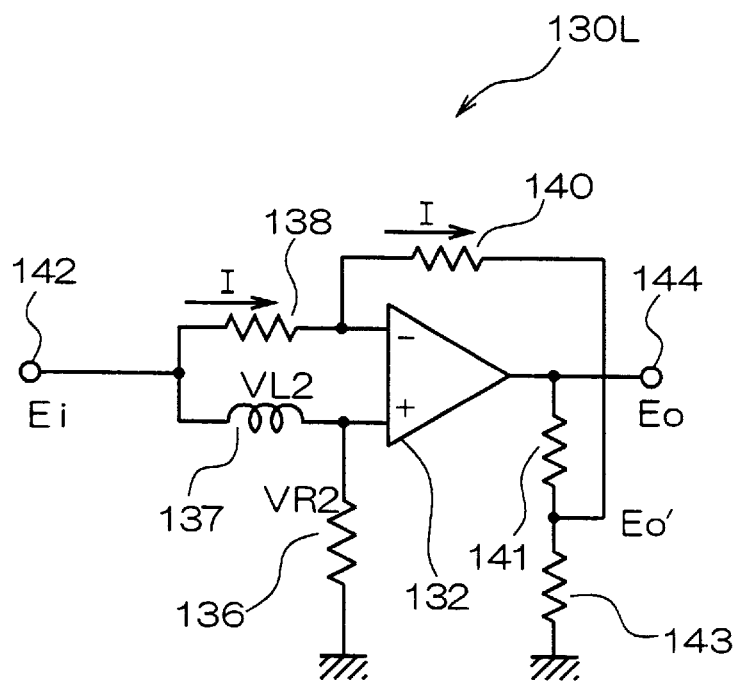
FIG. 15 is a circuit diagram showing another configuration of the phase shifting circuit which includes the LR circuit.

FIG. 15 is a circuit diagram showing another configuration of the phase shifting circuit which includes the LR circuit and which is replaceable with the posterior phase shifting circuit 130C of the oscillation circuit 10A shown in FIG. 13. The phase shifting circuit designated at 130L in the diagram includes an LR circuit consisting of a resistor 136 and an inductor 137, in lieu of the CR circuit consisting of the capacitor 134 and the resistor 136 within the posterior phase shifting circuit 130C shown in FIG. 13. The other configurations are substantially the same as those of the phase shifting circuit 130C. The phase shifting circuit 130L has a transfer function and phase-shift amount identical to those of the phase shifting circuit 130C.

In this manner, the phase shifting circuit 110L shown in FIG. 14 is equivalent to the phase shifting circuit 110C shown in FIG. 13, with a phase shifting circuit 130L shown in FIG. 15 being equivalent to the phase shifting circuit 130C shown in FIG. 13. Therefore, the phase shifting circuit 110C and/or the phase shifting circuit 130C can be replaced by the phase shifting circuit 110L and/or the phase shifting circuit 130L. In case both the phase shifting circuits 110C and 130C are replaced by the phase shifting circuits 110L and 130L, the entire tuning amplifier may be integrated so that a higher oscillation frequency can easily be acquired.

In case either of the two phase shifting circuits 110C and 130C is replaced by the phase shifting circuit 110L or 130L corresponding thereto, the entire tuning amplifier including the inductor making up the LR circuit or excluding the inductor may be integrated so that it becomes possible to prevent a variation in the oscillation frequency attributable to a change of the temperature, that is, to effect a so-called temperature compensation.

Besides, in case the phase shifting circuit 110C and/or the phase shifting circuit 130C shown in FIG. 13 are replaced by the phase shifting circuit 110L of FIG. 14 and/or the phase shifting circuit 130L of FIG. 15, either of the voltage dividing circuits connected to the output terminals of the operational amplifiers 112 and 132 in the respective phase shifting circuits may be eliminated or alternatively may be set to have a voltage dividing ratio equal to 1.

[Third Variant of Oscillation Circuit]

Figure 16:
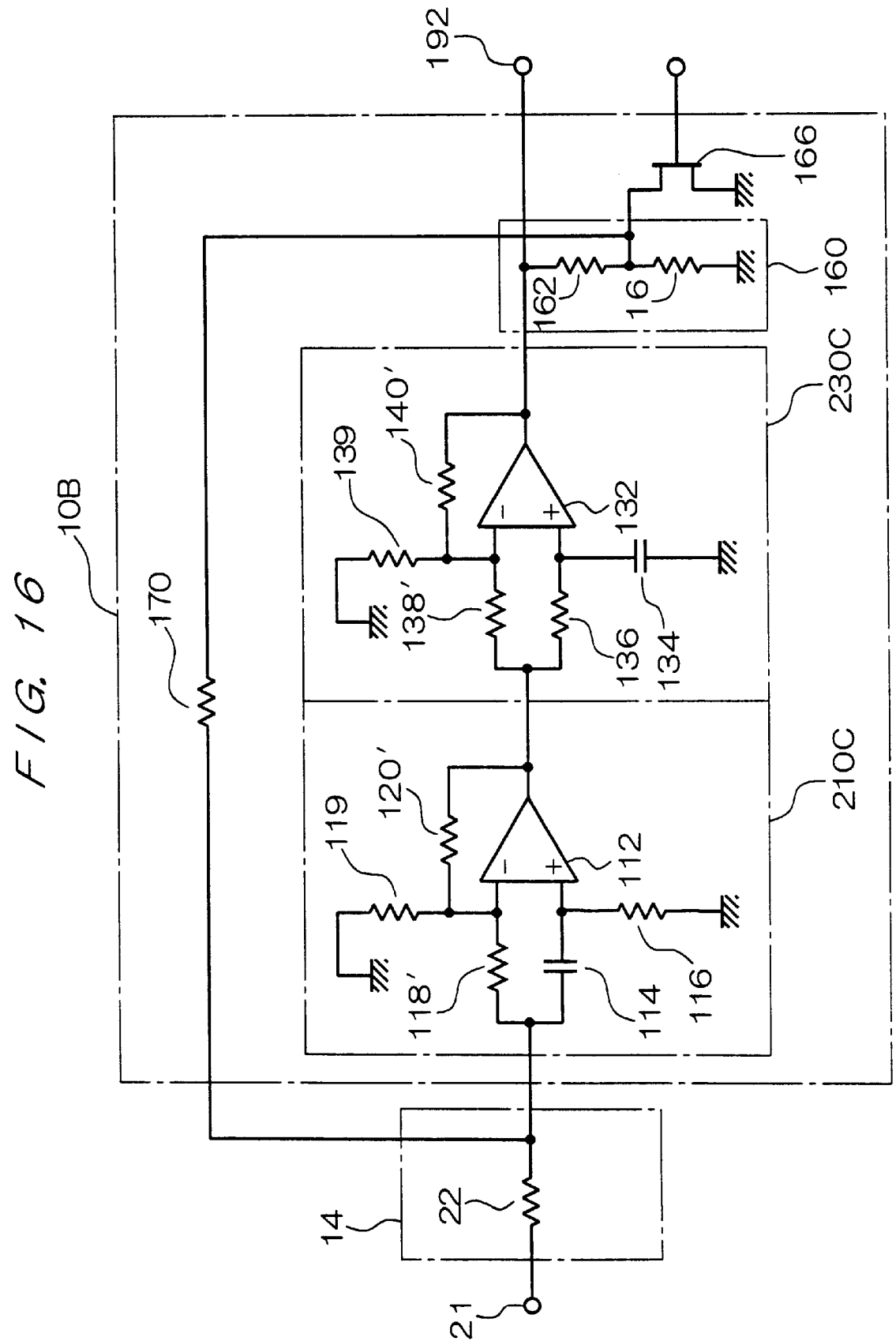
FIG. 16 is a circuit diagram showing a third variant of the oscillation circuit.

FIG. 16 is a circuit diagram showing a third variant of the oscillation circuit. The oscillation circuit designated at 10B in the diagram comprises an anterior phase shifting circuit 210C including no voltage dividing circuit therewithin. Instead, the resistance value of a resistor 120' is set to be larger than that of a resistor 118' so that the phase shifting circuit 210C can have a gain larger than 1. The other configurations are substantially the same as those of the phase shifting circuit 110C shown in FIG. 13, with the transfer function and the phase-shift amount thereof being basically the same as those of the phase shifting circuit 110C.

In the same manner, a posterior phase shifting circuit 230C includes no voltage dividing circuit therewithin. Instead, the resistance value of a resistor 140' is set to be larger than that of a resistor 138' so that the phase shifting circuit 230C can have a gain larger than 1. The other configurations are substantially the same as those of the phase shifting circuit 130C shown in FIG. 13, with the transfer function and the phase-shift amount thereof being basically the same as those of the phase shifting circuit 130C.

The output of the phase shifting circuit 230C is fed back to the anterior stage side by way of the voltage dividing circuit 160, with the variable resistor 166 connected in parallel to the resistor 164 making up the voltage dividing circuit 160. This variable resistor 166 is formed for example from a channel resistor of an FET. In response to the control voltage output from the AGC circuit 16 shown in FIG. 13, the gate voltage at the FET is regulated, in response to which the FET channel resistance is altered.

Resistors 119 and 139 are provided for suppressing a variation in the gain of the phase shifting circuits 210C and 230C, respectively, and preferably have respective resistance values R of the resistor 119 and resistor 139 given by expression (7) where r and mr denote resistance values of the resistors 118' and 120', respectively.

$$R = mr/(m-1) \tag{7}$$

Although the oscillation circuit 10B shown in FIG. 16 prevents a variation in the amplitude upon a change of the oscillation frequency by the connection of the resistors 119 and 139 to the phase shifting circuits 210C and 230C, respectively, the oscillation circuit may be configured without using the resistors 119 and 139 descried above. Alternatively, either the resistor 119 or the resistor 139 may merely be removed to configure the oscillation circuit.

In the oscillation circuit 10B shown in FIG. 16 the voltage dividing ratio of the voltage dividing circuit 160 is altered in response to the control voltage from the AGC circuit 16, although alteration may be made of a resistance ratio of the resistors 118' and 120' and/or a resistance ratio of the resistors 138' and 140' in response to the control voltage from the AGC circuit 16.

In the case of the oscillation circuit 10B shown in FIG. 16, an input signal is fed to the input circuit 14 disposed in front side of the anterior phase shifting circuit 210C, although the point to feed the input signal is not limited to the front side of the anterior phase shifting circuit 210C, but instead the input signal may be fed for example to the input circuit 14 interposed between the phase shifting circuit 210C and the phase shifting circuit 230C.

[Fourth Variant of Oscillation Circuit]

Although the oscillation circuit 10B shown in FIG. 16 comprised the phase shifting circuits each including the CR circuit, the oscillation circuit may comprise a phase shifting circuit including an LR circuit therewithin instead of the CR circuit.

Figure 17:
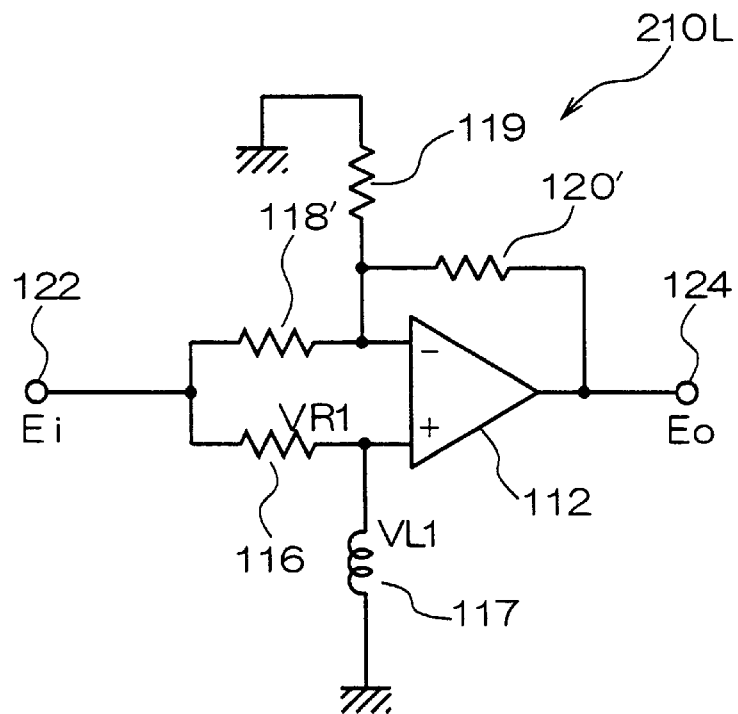
FIG. 17 is a circuit diagram showing a configuration of the phase shifting circuit which includes the LR circuit and which is a variant of a phase shifting circuit in FIG. 16.

FIG. 17 is a circuit diagram showing a configuration of the phase shifting circuit which includes the LR circuit and which is replaceable with the anterior phase shifting circuit 210C of the oscillation circuit 10B shown in FIG. 16. The phase shifting circuit designated at 210L in the diagram includes an LR circuit consisting of a resistor 116 and an inductor 117, in lieu of the CR circuit consisting of the capacitor 114 and the resistor 116 within the anterior phase shifting circuit 210C shown in FIG. 16. The other configurations are substantially the same as those of the phase shifting circuit 210C. The phase shifting circuit 210L has a transfer function and phase-shift amount identical to those of the phase shifting circuit 210C.

Figure 18:
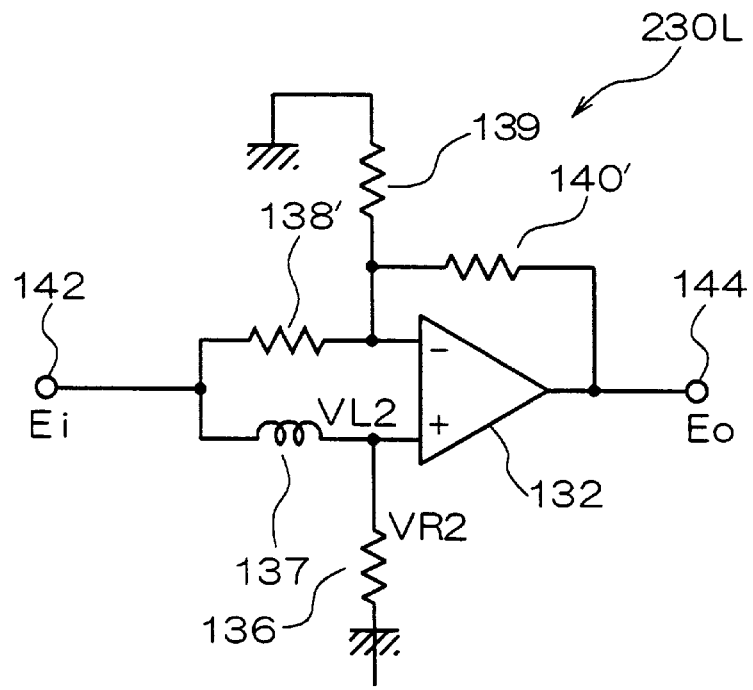
FIG. 18 is a circuit diagram showing another configuration of the phase shifting circuit which includes the LR circuit.

On the other hand, FIG. 18 is a circuit diagram showing another configuration of the phase shifting circuit which includes the LR circuit and which is replaceable with the posterior phase shifting circuit 230C of the oscillation circuit 10B shown in FIG. 16. The phase shifting circuit designated at 230L in the diagram includes an LR circuit consisting of an inductor 137 and a resistor 136, in lieu of the CR circuit consisting of the resistor 136 and the capacitor 134 within the posterior phase shifting circuit 230C shown in FIG. 16. The other configurations are substantially the same as those of the phase shifting circuit 230C. The phase shifting circuit 230L has a transfer function and phase-shift amount identical to those of the phase shifting circuit 230C.

In this manner, the phase shifting circuit 210L shown in FIG. 17 is equivalent to the phase shifting circuit 210C shown in FIG. 16, with a phase shifting circuit 230L shown in FIG. 18 being equivalent to the phase shifting circuit 230C shown in FIG. 16. Therefore, the phase shifting circuit 210C and/or the phase shifting circuit 230C shown in FIG. 16 can be replaced by the phase shifting circuit 210L and/or the phase shifting circuit 230L.

In case both the phase shifting circuits 210C and 230C are replaced by the phase shifting circuits 210L and 230L, the entire tuning amplifier may be integrated so that a higher oscillation frequency can easily be acquired. In case either of the two phase shifting circuits 210C and 230C is replaced by the phase shifting circuit 210L or 230L corresponding thereto, so that it becomes possible to prevent a variation in the oscillation frequency attributable to a change of the temperature.

[Fifth Variant of Oscillation Circuit]

The first to fourth variants of the oscillation circuit may employ a follower circuit in the form of a transistor connected to a part of the closed loop formed from two cascaded phase shifting circuits.

Figure 19:
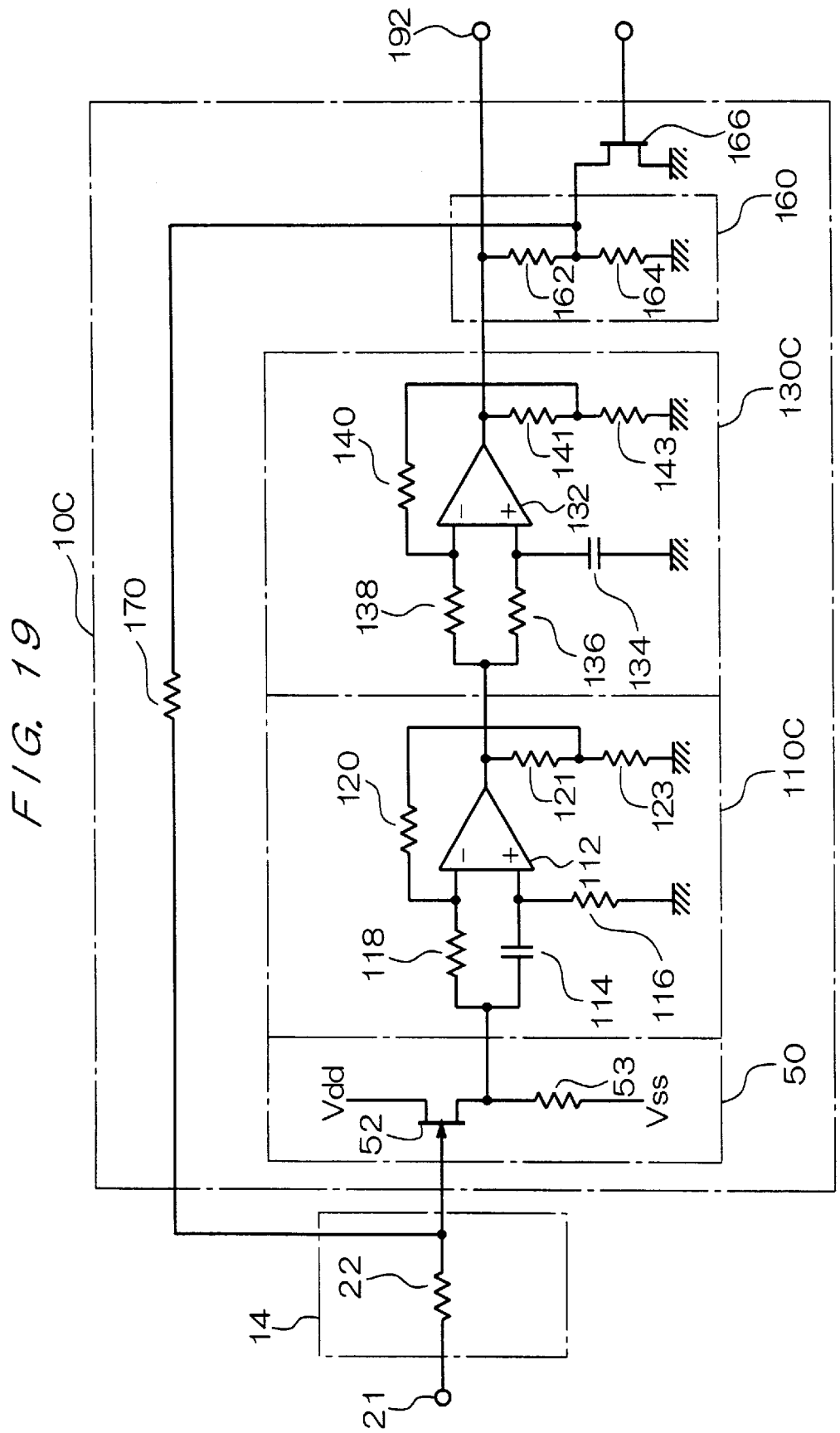
FIG. 19 is a circuit diagram showing a configuration of the oscillation circuit comprising a transistor based follower circuit disposed in front of two phase shifting circuits.

FIG. 19 is a circuit diagram showing a configuration of a fifth variant of the oscillation circuit. The oscillation circuit designated at 10C in the diagram comprises a transistor based follower circuit 50 disposed anterior to the anterior phase shifting circuit 110C of the oscillation circuit 10A shown in FIG. 13.

The follower circuit 50 includes an FET 52 having a drain connected to a positive power source Vdd and a source connected via a resistor 53 to a negative power source Vss. It is to be appreciated that the follower circuit 50 may be formed from an emitter follower circuit instead of the source follower circuit as shown in FIG. 19.

Thus, by cascading the transistor based follower circuit in front of the anterior phase shifting circuit 110C, etc., there can be compensated for a loss arising from the input impedance of the anterior phase shifting circuit 110C, etc., thereby making it possible to increase the resistance values of the feedback resistor 170 and the input resistor 22 as compared with the oscillation circuit 10A, etc., shown in FIG. 13, etc. In case the oscillation circuit 10C and other circuits are integrated on the semiconductor substrate in particular, a larger element occupancy area is required to diminish the resistance value of the feedback resistor 170, etc. It is therefore desired that the resistance value of the feedback resistor 170, etc., be increased to a certain extent by the provision of the follower circuit.

Although the oscillation circuit 10C shown in FIG. 19 alters a voltage dividing ratio of the voltage dividing circuit 160 in response to the control voltage output from the AGC circuit 16, there may be altered in response to the control voltage from the AGC circuit 16 the voltage dividing ratio of the voltage dividing circuit in the phase shifting circuit 110C and/or the voltage dividing ratio of the voltage diving circuit in the phase shifting circuit 130C.

In the case of the oscillation circuit 10C shown in FIG. 19, an input signal is fed to the input circuit 14 disposed in front of the anterior phase shifting circuit 110C, although the point to feed the input signal is not limited to the front side of the anterior phase shifting circuit 110C, but instead the input signal may be fed for example to the input circuit 14 interposed between the phase shifting circuit 110C and the phase shifting circuit 130C. In this case, it is desired that the follower circuit 50 shown in FIG. 19 be interposed between the phase shifting circuit posterior to the input circuit 14 and the input circuit 14.

[Sixth Variant of Oscillation Circuit]

Although the oscillation circuit 10A shown in FIG. 13 has a 360° combined phase-shift amount of the two phase shifting circuits 110C and 130C, the oscillation circuit may comprise a non-inverting circuit allowing no phase shifting connected to the cascaded phase shifting circuits 110C and 130C.

Figure 20:
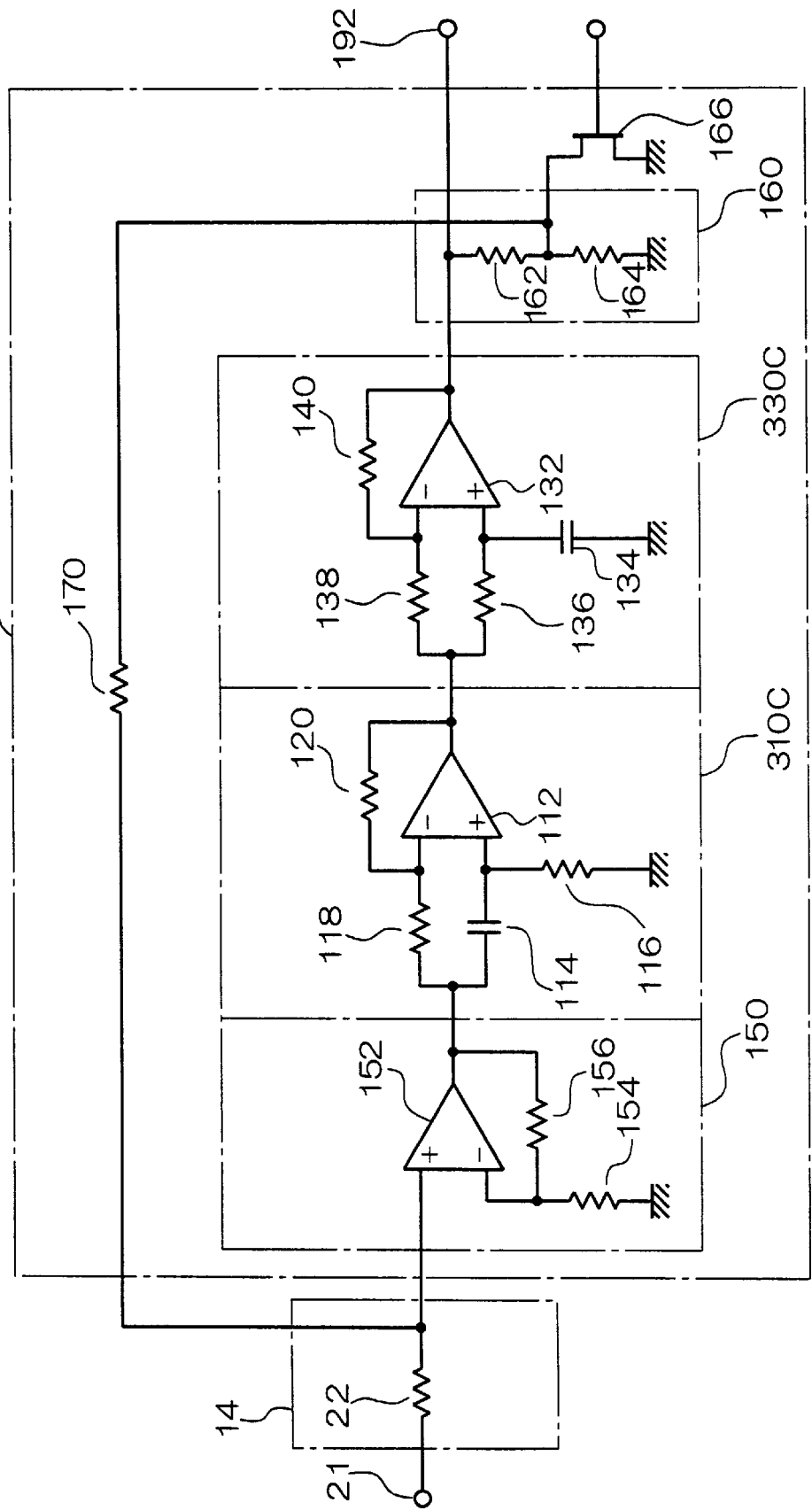
FIG. 20 is a circuit diagram showing a configuration of the oscillation circuit comprising a non inverting circuit disposed in front of two phase shifting circuits.

FIG. 20 is a circuit diagram showing a configuration of the oscillation circuit 10D comprising a non-inverting circuit 150 disposed in front of two phase shifting circuits. As shown in the diagram, the phase shifting circuits designated at 310C and 330C within the oscillation circuit 10D have the same configurations as those of the phase shifting circuits 110C and 130C shown in FIG. 13 except that no voltage dividing circuit is connected to the output terminals of the operational amplifiers 112 and 132. The transfer function and the phase-shift amount are also identical to those of the phase shifting circuits 110C and 130C. It is to be noted that $a_1=1$ in the expression (5) and that $a_2=1$ in the expression (6).

The non-inverting circuit 150 includes an operational amplifier 152 having a non-inverting input terminal for receiving an AC signal and an inverting input terminal connected via a resistor 154 to the ground, and a resistor 156 interposed between the inverting input terminal and the output terminal of the operational amplifier 152. The non-inverting circuit 150 has a predetermined gain determined depending on the resistance ratio between the two resistors 154 and 156.

The two phase shifting circuits 310C and 330C have a gain equal to 1 in common. Therefore, instead of achieving the gain by each phase shifting circuit, the oscillation circuit 10D shown in FIG. 20 sets the gain of the non-inverting circuit 150 to a value larger than 1 so that the closed loop including the two phase shifting circuits 310C and 330C can acquire a loop gain equal to or more than 1, thereby allowing a predetermined oscillation.

Although the oscillation circuits 10D shown in FIG. 20 vary the voltage dividing ratio of the voltage dividing circuit 160 in response to the control voltage output from the AGC circuit 16, the gain of the non-inverting circuit 150 may be varied in response to the control voltage from the AGC circuit 16.

[Seventh Variant of Oscillation Circuit]

The above-described oscillation circuits 10A, 10B, 10C and 10D performed a predetermined oscillating action at a frequency allowing the combined phase-shift amount of the two phase shifting circuits to become equal to 360°. However, the oscillation circuit may comprise a combination of two phase shifting circuits performing basically the same action so that a predetermined oscillating action is achieved at a frequency allowing the combined phase-shift amount of the two phase shifting circuits to become equal to 180°.

Figure 21:
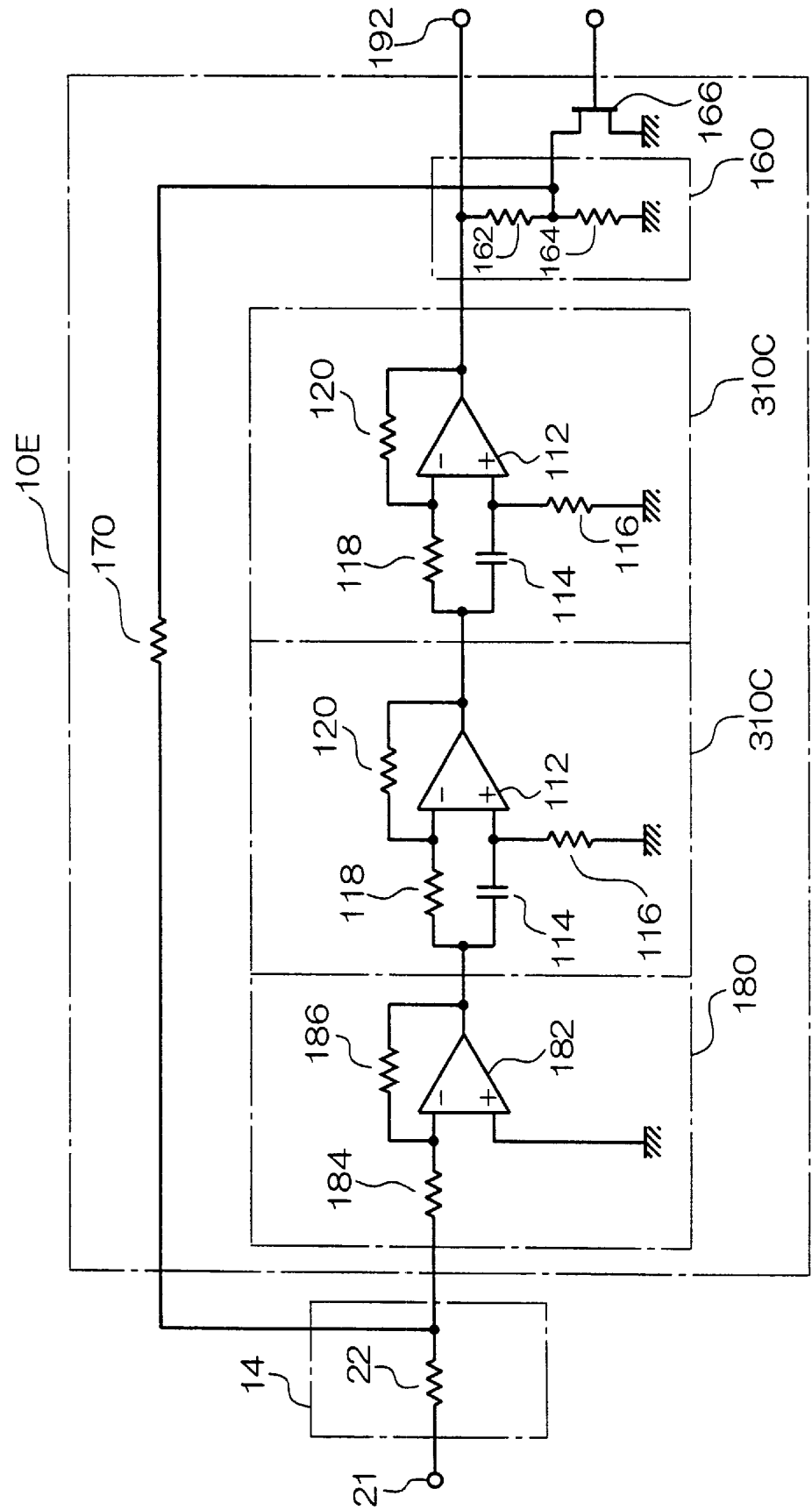
FIG. 21 is a circuit diagram showing a configuration of the oscillation circuit comprising two cascaded the phase shifting circuits 310C.

FIG. 21 is a circuit diagram showing a seventh variant of the oscillation circuit. The phase shifting circuit 310C is provided in place of the posterior phase shifting circuit 330C shown in FIG. 20, with a phase inverting circuit 180 in lieu of the non-inverting circuit 150.

The phase inverting circuit 180 includes an operational amplifier 182 having an inverting input terminal receiving an input AC signal by way of a resistor 184 and having a grounded non-inverting input terminal, and a resistor 186 disposed between the inverting input terminal and the output terminal of the operational amplifier 182. When an AC signal is fed via the resistor 184 to the inverting input terminal of the operational amplifier 182, the output terminal of the operational amplifier 182 issues an anti phase signal having an inverted phase, which signal in turn is fed to the anterior phase shifting circuit 310C. The phase inverting circuit 180 has a predetermined amplification degree depending on a ratio of the resistance between the two resistors 184 and 186, so that a gain larger than 1 can be obtained by setting the resistance value of the resistor 186 to be larger than the resistance value of the resistor 184.

Due to the fact that the two phase shifting circuits 310C achieve 180° phase shifting at a predetermined frequency and that the phase is inverted by the phase inverting circuit 180, the phase makes a 360° phase shifting cycle as a whole, ensuring a predetermined oscillation.

[Eighth Variant of Oscillation Circuit]

Figure 22:
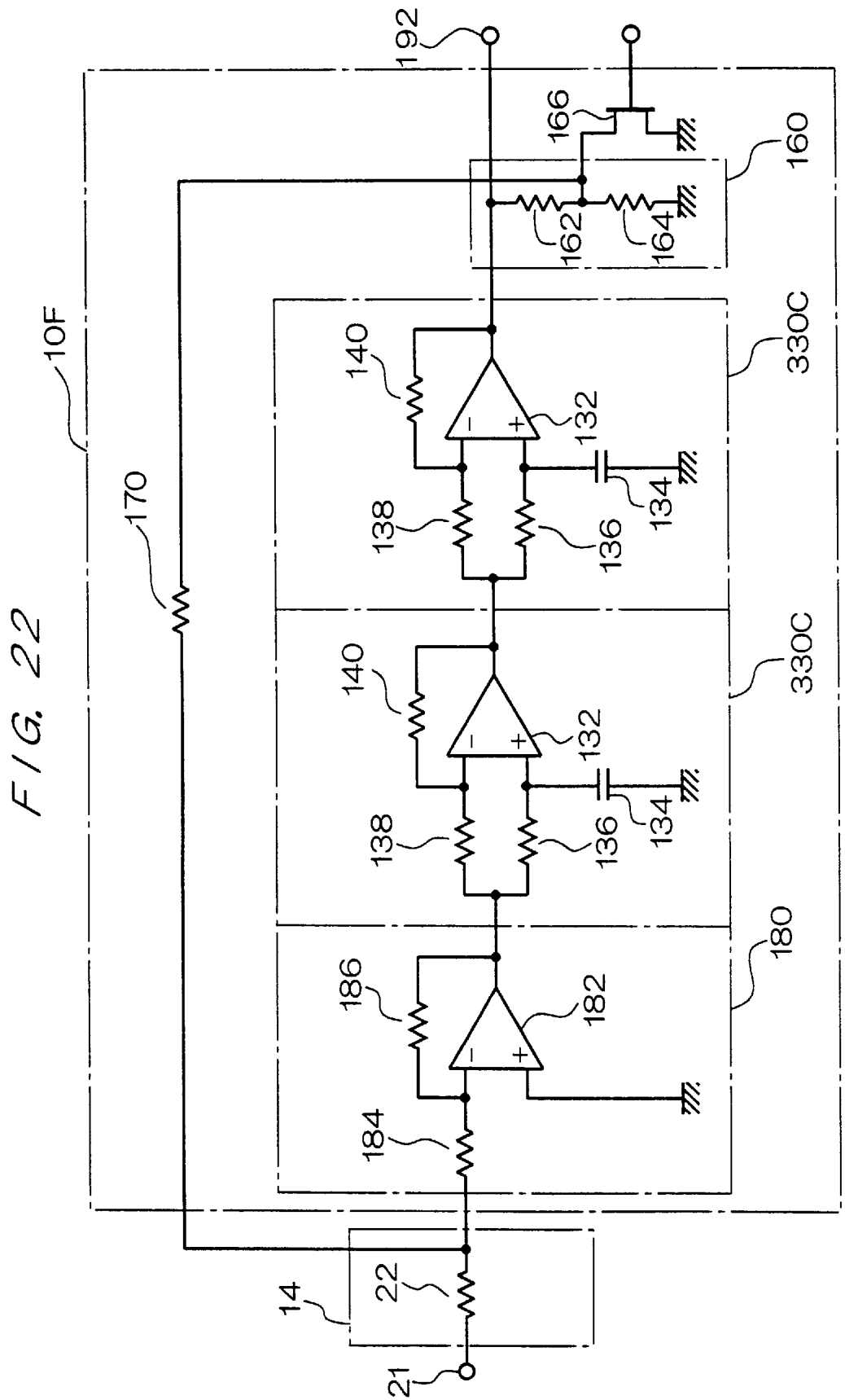
FIG. 22 is a circuit diagram showing a configuration of the oscillation circuit comprising two cascaded the phase shifting circuits 330C.

Although the oscillation circuit 10E shown in FIG. 21 comprised two cascaded phase shifting circuits 310C by way of example, the oscillating action could also be achieved by cascading two phase shifting circuits 330C as shown in FIG. 22.

An oscillation circuit 10F shown in FIG. 22 allows the two phase shifting circuits 330C to perform 180° phase shifting at a predetermined frequency, as well as a phase inversion achieved by the phase inverting circuit 180, with the result that the phase makes a 360° phase shifting cycle as a whole, ensuring a predetermined oscillation.

By the way, the oscillation circuits 10D, 10E and 10F shown in FIGS. 20 to 22 each comprised two phase shifting circuits each including the CR circuit, although each phase shifting circuit may include an LR circuit. In the oscillation circuit 10D shown in FIG. 20 for example, the anterior phase shifting circuit 310C may be substituted by a phase shifting circuit obtained by excluding the voltage dividing circuit from the phase shifting circuit 110L shown in FIG. 14, or alternatively the posterior phase shifting circuit 330C may be substituted by a phase shifting circuit obtained by excluding the voltage dividing circuit from the phase shifting circuit 130L shown in FIG. 15.

Although the oscillation circuits 10E and 10F shown in FIGS. 21 and 22 vary the voltage dividing ratio of the voltage dividing circuit 160 in response to the control voltage output from the AGC circuit 16 shown in FIG. 3, the gain of the phase inverting circuit 180 may be varied in response to the control voltage from the AGC circuit 16. In this case, the output from the phase shifting circuit 130C may be fed directly back to the anterior stage, with the exclusion of the voltage dividing circuit 160 posterior to the phase shifting circuit 130C. Alternatively, the resistance value of the resistor 162 within the voltage dividing circuit 160 may be reduced to an extremely small value with the voltage dividing ratio equal to 1.

In the case of the oscillation circuits 10D, 10E and 10F shown in FIGS. 20 to 22, an input signal was fed to the input circuit 14 disposed in front of the anterior phase shifting circuit. However, the point to feed the input signal is not limited to the front side of the anterior phase shifting circuit, but instead the input signal may be fed to the input circuit 14 interposed between the two phase shifting circuits for example.

Besides, the point to connect the non-inverting circuit 150 and the phase inverting circuit 180 shown in FIGS. 20 to 22 is not limited to the front side of the anterior phase shifting circuit, but instead they may be provided between the two phase shifting circuits or on the rear side of the posterior phase shifting circuit.

[Ninth Variant of Oscillation Circuit]

All the first to eighth variants of the oscillation circuit described hereinabove comprised the phase shifting circuits each including the operational amplifier, although each phase shifting circuit may include a transistor in place of the operational amplifier.

Figure 23:
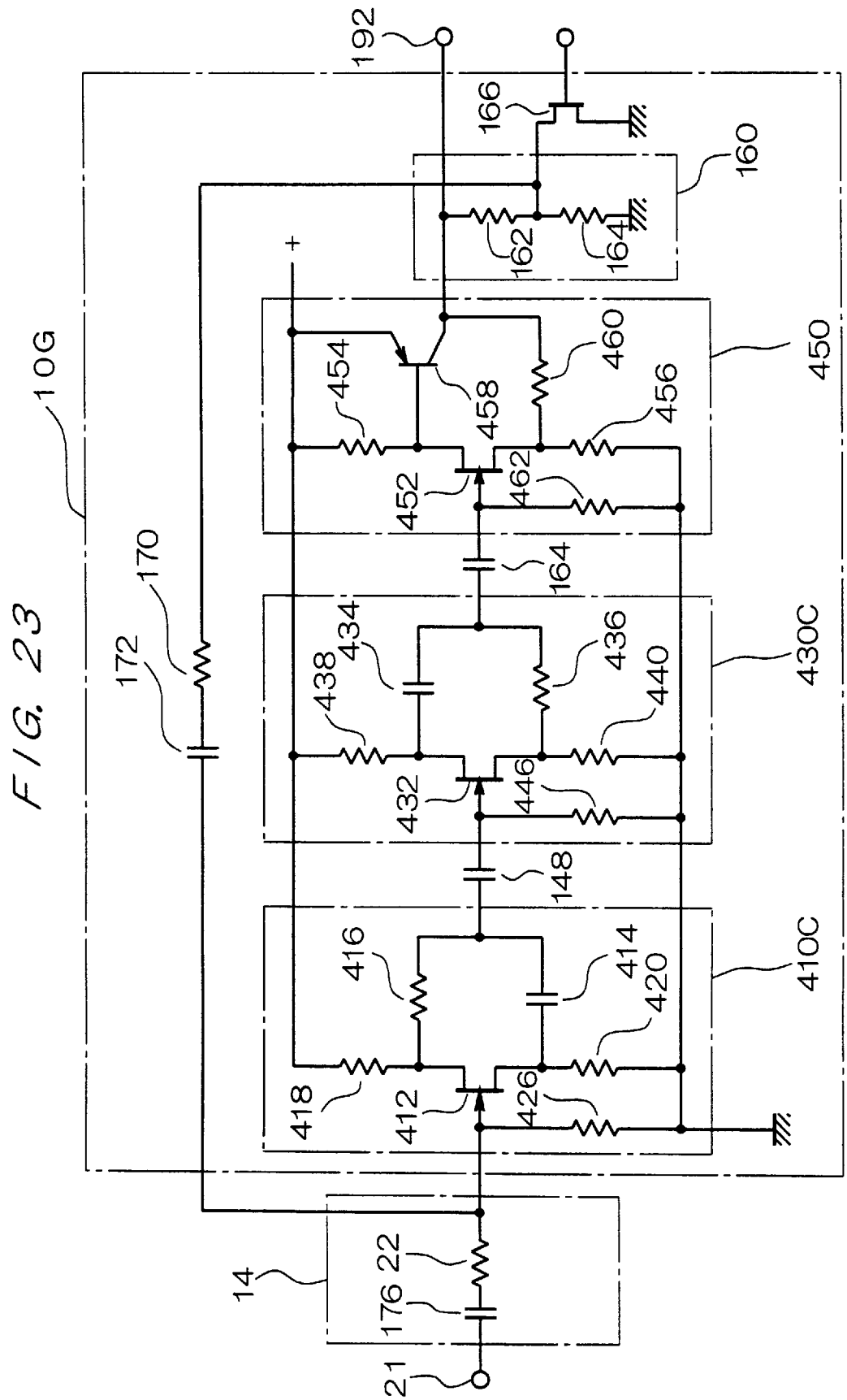
FIG. 23 is a circuit diagram showing a configuration of the oscillation circuit cascaded the phase shifting circuit includes the transistor.

An oscillation circuit 10G shown in FIG. 23 comprises two phase shifting circuits 410C and 430C each allowing a predetermined amount of phase shifting of an input AC signal to thereby achieve in cooperation a total of 360° phase shifting at a predetermined frequency, a non-inverting circuit 450 for providing through the amplification of a predetermined amplification degree an output signal from the phase shifting circuit 430C without changing the phase of the signal, a voltage dividing circuit 160 including resistors 162 and 164 disposed posterior to the non-inverting circuit 450, and a feedback resistor 170.

The anterior phase shifting circuit 410C shown in FIG. 23 generates in-phase and anti phase signals from an input signal by means of an FET 412 and combines these two signals by way of a capacitor 414 or a resistor 416 to obtain an output signal.

The transfer function of the phase shifting circuit 410C can intactly be K1 given by the expression (5) where $T_1$ is a time constant of a CR circuit consisting of the capacitor 414 and the resistor 416 (note that $a_1<1$). The phase-shift amount is also equal to that of the phase shifting circuit 110C shown in FIG. 13.

On the other hand, the posterior phase shifting circuit 430C shown in FIG. 23 generates in-phase and anti phase signals from an input signal by means of an FET 432 and combines these two signals by way of a resistor 436 or a capacitor 434 to obtain an output signal.

The transfer function of the phase shifting circuit 430C can intactly be K2 given by the expression (6) where $T_2$ is a time constant of a CR circuit consisting of the capacitor 434 and the resistor 436 (note that $a_2<1$). The phase-shift amount is also equal to that of the phase shifting circuit 130C shown in FIG. 13.

The non-inverting circuit 450 shown in FIG. 23 includes an FET 452 connected to a resistor 454 interposed between its drain and a positive power source and to a resistor 456 interposed between its source and the earth, a transistor 458 having a base connected to the drain of the FET 452 and a collector connected via a resistor 460 to the source of the FET 452, and a resistor 462 for applying an appropriate bias voltage to the FET 452.

When the FET 452 receives an AC signal through its gate, it provides an anti phase signal as its output through the drain. When the transistor 458 receives the anti phase signal through its base, it provides as its output through the collector a signal having a further inverted phase, that is, a signal in phase with the signal input to the gate of the FET 452. The resultant signal is provided as an output from the non-inverting circuit 450.

The combined phase shifting circuits 410C and 430C achieve a total of 360° phase shifting at a predetermined frequency. At that time, the gain of the non-inverting circuit 450 is regulated so as to obtain a loop gain equal to or more than 1, thereby ensuring a predetermined oscillating action.

Although the voltage dividing circuit 160 is disposed posterior to the non-inverting circuit 450 so that the resistance value of the variable resistor 166 connected in parallel to the resistor 164 is regulated in response to a control voltage output from the AGC circuit 16 to provide an amplitude control, the gain of the non-inverting circuit 450 may be regulated by varying the resistance value of e.g., the resistor 460 within the non-inverting circuit 450.

In the case of the oscillation circuit 10G shown in FIG. 23, an input signal is fed to the input circuit 14 disposed in front side of the anterior phase shifting circuit 410C, although the point to feed the input signal is not limited to the front side of the anterior phase shifting circuit 410C, but instead the input signal may be fed for example to the input circuit 14 interposed between the phase shifting circuit 410C and the phase shifting circuit 430C.

[Tenth Variant of Oscillation Circuit]

Although the oscillation circuit 10G shown in FIG. 23 comprised the phase shifting circuit 410C and the phase shifting circuit 430C each including the CR circuit, the oscillation circuit may comprise a phase shifting circuit including an LR circuit consisting of the resistor and the inductor therewithin instead of the CR circuit.

Figure 24:
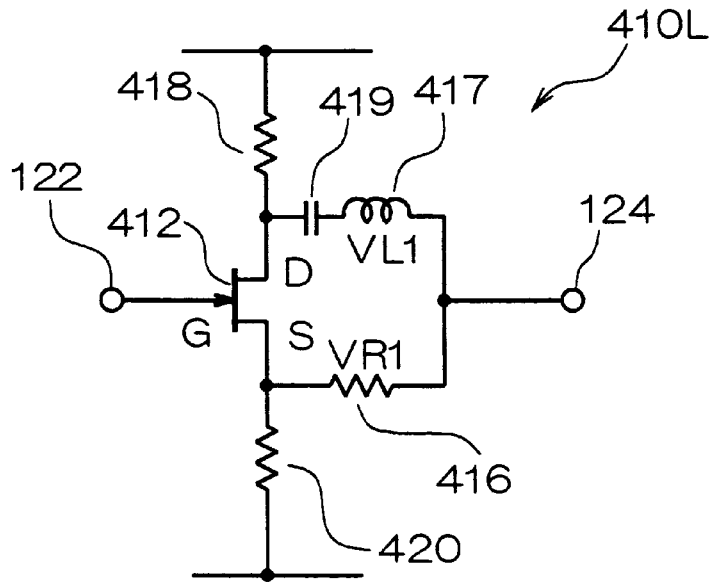
FIG. 24 is a circuit diagram showing a configuration of the phase shifting circuit which includes the LR circuit and which is a variant of a phase shifting circuit in FIG. 23.

FIG. 24 is a circuit diagram showing a configuration of the phase shifting circuit which includes the LR circuit and which is replaceable with the anterior phase shifting circuit 410C in the oscillation circuit 10G shown in FIG. 23. A phase shifting circuit 410L shown in FIG. 24 has a configuration including an LR circuit consisting of the resistor 416 and an inductor 417 in place of the CR circuit consisting of the capacitor 414 and the resistor 416 within the anterior phase shifting circuit 410C shown in FIG. 23. The resistors 418 and 420 are so set as to have the same resistance value. A capacitor 419 is interposed between the inductor 417 and the drain of the FET 412 and serves to block a direct current.

Figure 25:
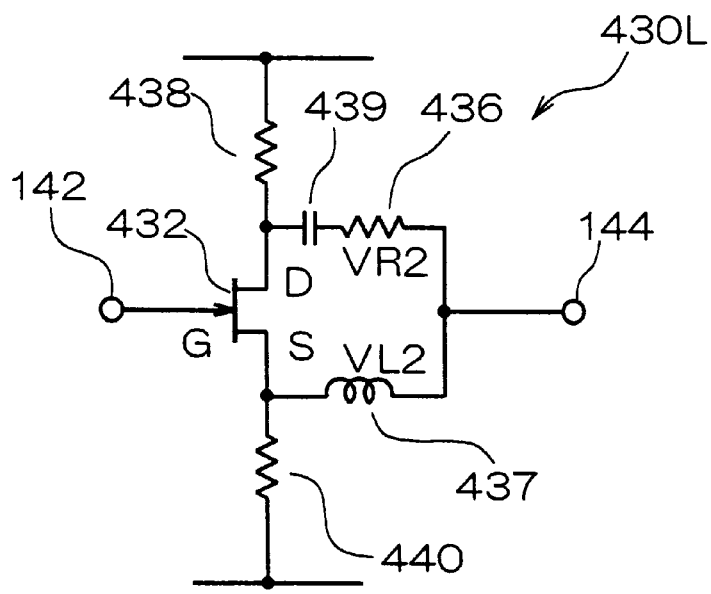
FIG. 25 is a circuit diagram showing another configuration of the phase shifting circuit which includes the LR circuit.

FIG. 25 is a circuit diagram showing another configuration of the phase shifting circuit which includes the LR circuit and which is replaceable with the posterior phase shifting circuit 430C in the oscillation circuit 10G shown in FIG. 23. A phase shifting circuit 430L shown in FIG. 25 has a configuration including an LR circuit consisting of the resistor 436 and an inductor 437 in place of the CR circuit consisting of the capacitor 434 and the resistor 436 within the posterior phase shifting circuit 430C shown in FIG. 23. The resistors 438 and 440 are so set as to have the same resistance value. A capacitor 439 is interposed between the resistor 436 and the drain of the FET 432 and serves to block a direct current.

In this manner, the phase shifting circuit 410C and/or the phase shifting circuit 430C shown in FIG. 23 can be replaced by the phase shifting circuit 410L and/or the phase shifting circuit 430L shown in FIGS. 24, 25.

[Eleventh Variant of Oscillation Circuit]

Although cascaded in FIG. 23 are two phase shifting circuits 410C and 430C having different phase shifting directions, the oscillating action may be achieved by cascading two phase shifting circuits 410C or two phase shifting circuits 430C.

Figure 26:
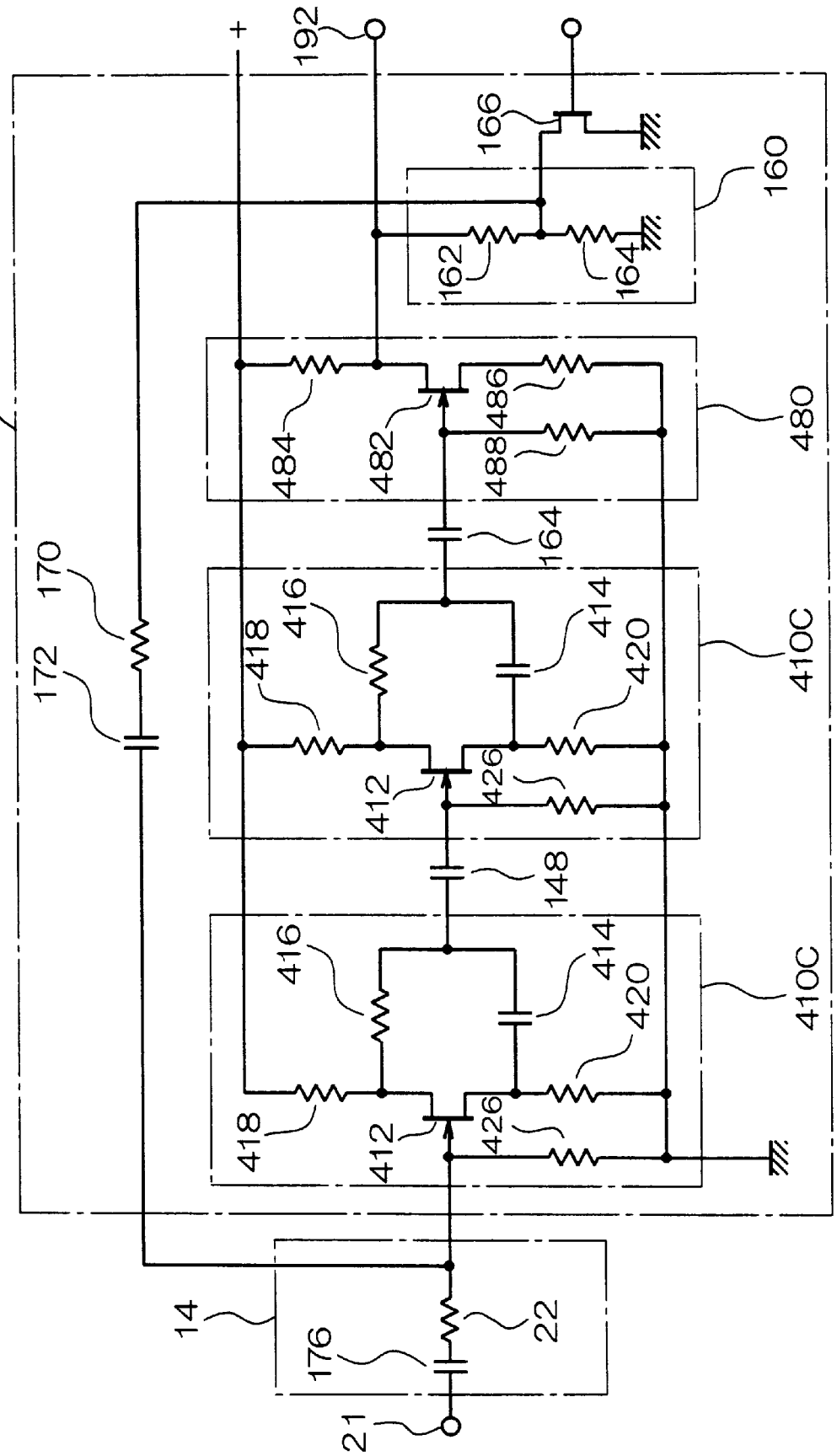
FIG. 26 is a circuit diagram showing a configuration of the oscillation circuit comprising two cascaded phase shifting circuits 410C.
Figure 27:
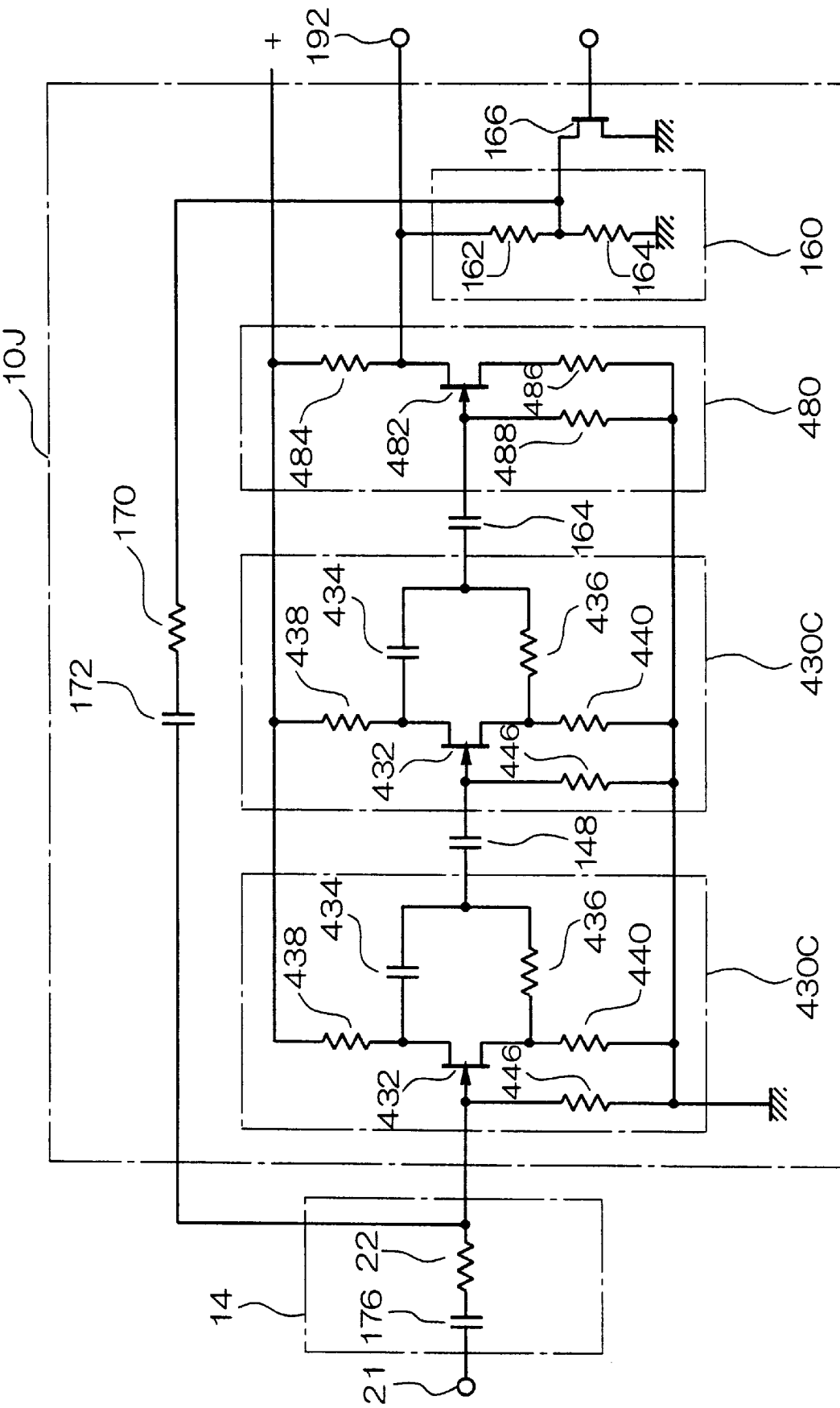
FIG. 27 is a circuit diagram showing a configuration of the oscillation circuit comprising two cascaded phase shifting circuits 430C.

FIG. 26 is a circuit diagram showing an eleventh variant in the form of an oscillation circuit 10H comprising two cascaded phase shifting circuits 410C. FIG. 27 is a circuit diagram of an oscillation circuit 10J comprising two cascaded phase shifting circuits 430C.

A phase inverting circuit 480 making up the oscillation circuits 10H and 10J includes an FET 482 connected to a resistor 484 interposed between its drain and a positive power source and connected to a resistor 486 interposed between its source and the earth, and a resistor 488 for applying a predetermined bias voltage to a gate of the FET 482. The phase inverting circuit 480 has a predetermined gain depending on a resistance ratio between the two resistors 484 and 486.

The combined two phase shifting circuits 410C or the combined two phase shifting circuits 430C achieve a total of 180° phase shifting at a predetermined frequency, with a loop gain set to 1 or more through the regulation of the gain of the phase inverting circuit 480, to thereby ensure a predetermined oscillating action.

Incidentally, the oscillation circuits 10G, 10H and 10J shown in FIGS. 23, 26 and 27, respectively, comprise two phase shifting circuits and a non-inverting circuit or two phase shifting circuits and a phase inverting circuit so that the combined three circuits achieve in cooperation a total of 360° phase shifting at a predetermined frequency to thereby ensure a predetermined oscillating action. Therefore, when attention is given to only the phase-shift amount, the order of connection of the three circuits has a certain degree of freedom, allowing the order of connection to be determined as needed.

Although the above-described oscillation circuits 10H and 10J comprised the phase shifting circuits including the CR circuits therewithin by way of example, the oscillation circuit may comprise cascaded phase shifting circuits each including an LR circuit.

Besides, in the oscillation circuits 10H and 10J shown in FIGS. 26 and 27, respectively, the voltage dividing ratio of the voltage dividing circuit 160 is varied depending on a control voltage output from the AGC circuit 16. Instead, however, the gain of the phase inverting circuit 480 may be regulated by varying the resistance value of, e.g., the resistor 460 within the phase inverting circuit 480 in response to the control voltage from the AGC circuit 16.

In the case of the oscillation circuit 10H and 10J, an input signal is fed to the input circuit 14 disposed in front side of the anterior phase shifting circuit, although the point to feed the input signal is not limited to the front side of the anterior phase shifting circuit, but instead the input signal may be fed for example to the input circuit 14 interposed between the anterior phase shifting circuit and the posterior phase shifting circuit.

[Twelfth Variant of Oscillation Circuit]

Figure 28:
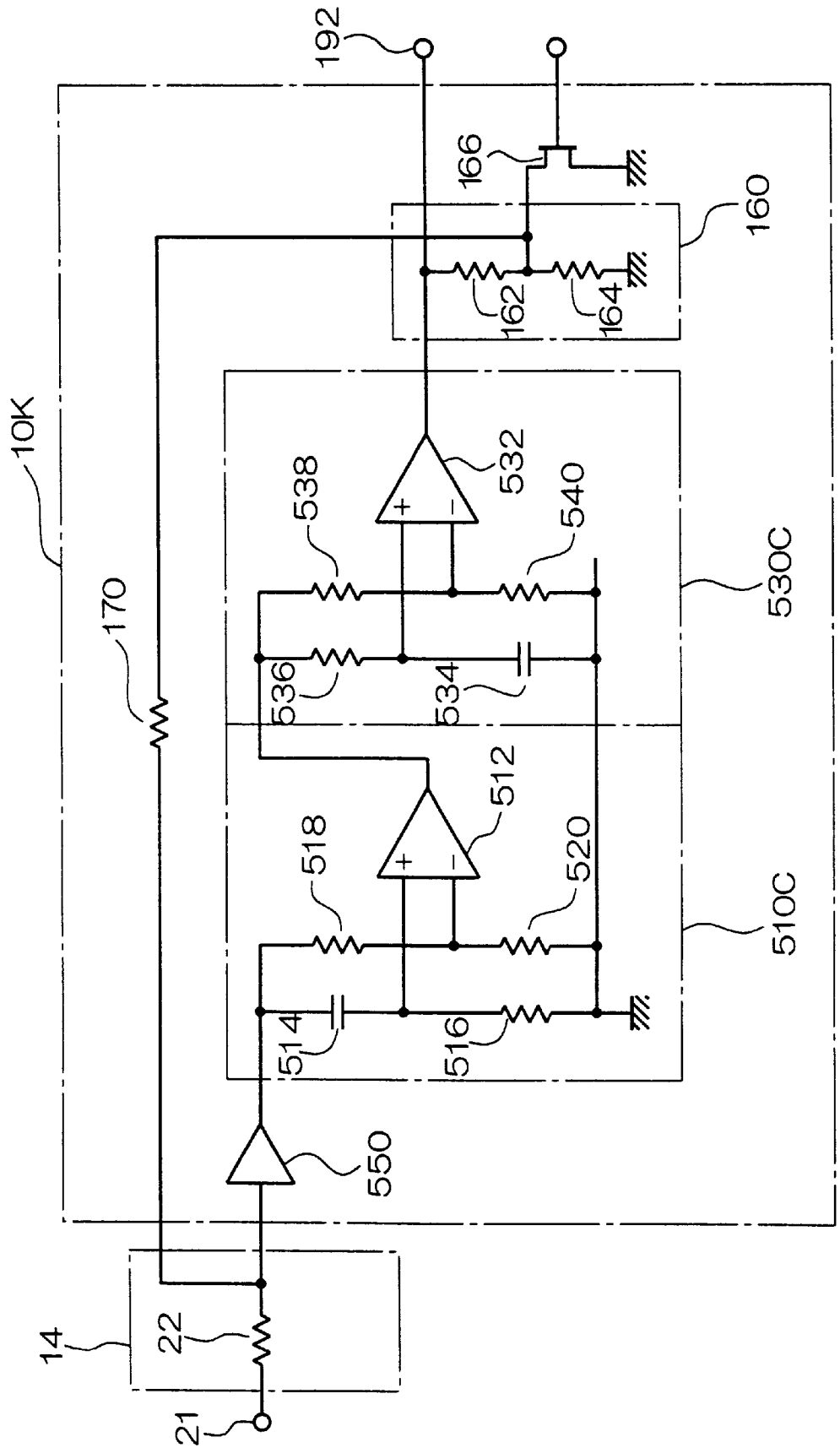
FIG. 28 is a circuit diagram showing a variant of the oscillation circuit.

FIG. 28 is a circuit diagram showing a twelfth variant of the oscillation circuit. The oscillation circuit designated at 10K in the diagram comprises a non-inverting circuit 550 for providing as its output an input AC signal without inverting its phase, two phase shifting circuits 510C and 530C each allowing a predetermined amount of phase shifting of the input signal to achieve in cooperation a total of 360° phase shifting, a voltage dividing circuit 160 consisting of the resistors 162 and 164 disposed posterior to the posterior phase shifting circuit 530C, and a feedback resistor 170.

It is to be appreciated that the non-inverting circuit 550 functions as a buffer circuit. This non-inverting circuit 550 may be excluded from the oscillation circuit.

The anterior phase shifting circuit 510C shown in FIG. 28 includes a differential amplifier 512 which amplifies for output a differential voltage of two inputs with a predetermined amplification degree, a capacitor 514 and a resistor 516 (which make up a second series circuit) which allow a predetermined amount of phase shifting of a signal input to the phase shifting circuit 510C for the input to the non-inverting input terminal of the differential amplifier 512, and resistors 518 and 520 (which make up a first series circuit) which divide the voltage level of the input signal in about half without inverting its phase for the input to the inverting input terminal of the differential amplifier 512.

The transfer function of this phase shifting circuit 510C can intactly be K1 given by the expression (5) where $T_1$ is a time constant of the CR circuit consisting of the capacitor 514 and the resistor 516. The phase-shift amount is also equal to that of the phase shifting circuit 110C shown in FIG. 13.

On the other hand, the posterior phase shifting circuit 530C shown in FIG. 28 includes a differential amplifier 532 which amplifies for output a differential voltage of two inputs with a predetermined amplification degree, a resistor 536 and a capacitor 534 (which make up a second series circuit) which allow a predetermined amount of phase shifting of a signal input to the phase shifting circuit 530C for the input to the non-inverting input terminal of the differential amplifier 532, and resistors 538 and 540 (which make up a first series circuit) which divide the voltage level of the input signal in about half without inverting its phase for the input to the inverting input terminal of the differential amplifier 532.

The transfer function of this phase shifting circuit 530C can intactly be K2 given by the expression (6) where $T_2$ is a time constant of the CR circuit consisting of the resistor 536 and the capacitor 534. The phase-shift amount is also equal to that of the phase shifting circuit 130C shown in FIG. 13.

The combined phase shifting circuits 510C and 530C achieve in cooperation a total of 360° phase shifting at a predetermined frequency, with a loop gain set to 1 or more through a regulation of the gain of the phase shifting circuit 510C and/or the phase shifting circuit 530C, to thereby ensure a predetermined oscillating action.

Besides, in case of the oscillation circuit 10K shown in FIG. 28, the voltage dividing ratio of the voltage dividing circuit 160 is varied depending on a control voltage output from the AGC circuit 16, although the amplification degree of at least one of the differential amplifiers 512 and 532 and the non-inverting circuit 550 may be varied on the basis of the control voltage from the AGC circuit 16.

In the case of the oscillation circuit 10K shown in FIG. 28, an input signal is fed to the input circuit 14 disposed in front side of the anterior phase shifting circuit 510C, although the point to feed the input signal is not limited to the front side of the anterior phase shifting circuit 510C, but instead the input signal may be fed for example to the input circuit 14 interposed between the phase shifting circuit 510C and the phase shifting circuit 530C.

[Thirteenth Variant of Oscillation Circuit]

Although the oscillation circuit 10K shown in FIG. 28 comprised the phase shifting circuits 510C and 530C each including the CR circuit, the oscillation circuit may comprise phase shifting circuits including LR circuits each consisting of a resistor and an inductor in place of the CR circuits.

Figure 29:
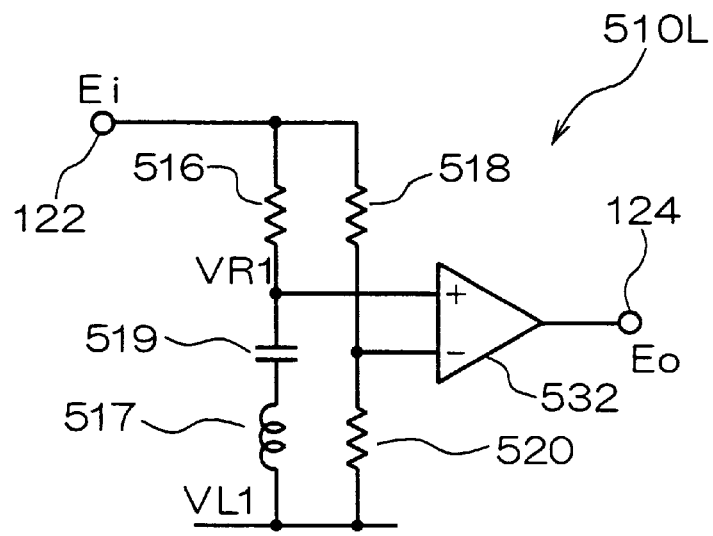
FIG. 29 is a circuit diagram showing a configuration of the phase shifting circuit which includes the LR circuit and which is a variant of a phase shifting circuit in FIG. 28.

FIG. 29 is a circuit diagram showing another configuration of a phase shifting circuit including the LR circuit. The phase shifting circuit designated at 510L in the diagram has a configuration including the LR circuit consisting of the resistor 516 and an inductor 517 in place of the CR circuit consisting of the capacitor 514 and the resistor 516 within the phase shifting circuit 510C shown in FIG. 28.

Figure 30:
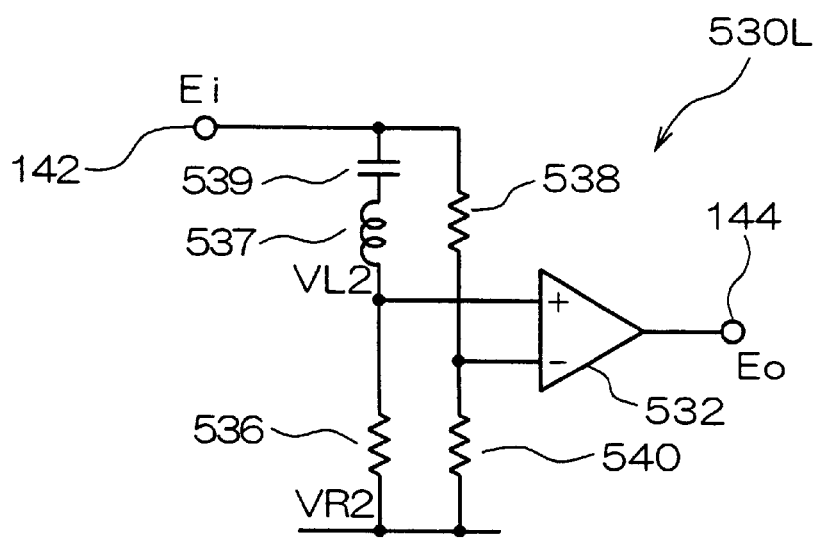
FIG. 30 is a circuit diagram showing another configuration of the phase shifting circuit which includes the LR circuit.

FIG. 30 is a circuit diagram showing a further configuration of a phase shifting circuit including the LR circuit. The phase shifting circuit designated at 530L in the diagram has a configuration including the LR circuit consisting of an inductor 537 and the resistor 536 in place of the CR circuit consisting of the resistor 536 and the capacitor 534 within the phase shifting circuit 530C shown in FIG. 28.

In this manner, both or either of the two phase shifting circuits 510C and 530C can be substituted by the phase shifting circuit 510L of FIG. 29 and/or the phase shifting circuit 530L of FIG. 30.

[Fourteenth Variant of Oscillation Circuit]

Although cascaded in FIG. 28 are two phase shifting circuits 510C and 530C having different phase shifting directions, the oscillating action may be achieved by cascading two phase shifting circuits 510C or two phase shifting circuits 530C.

Figure 31:
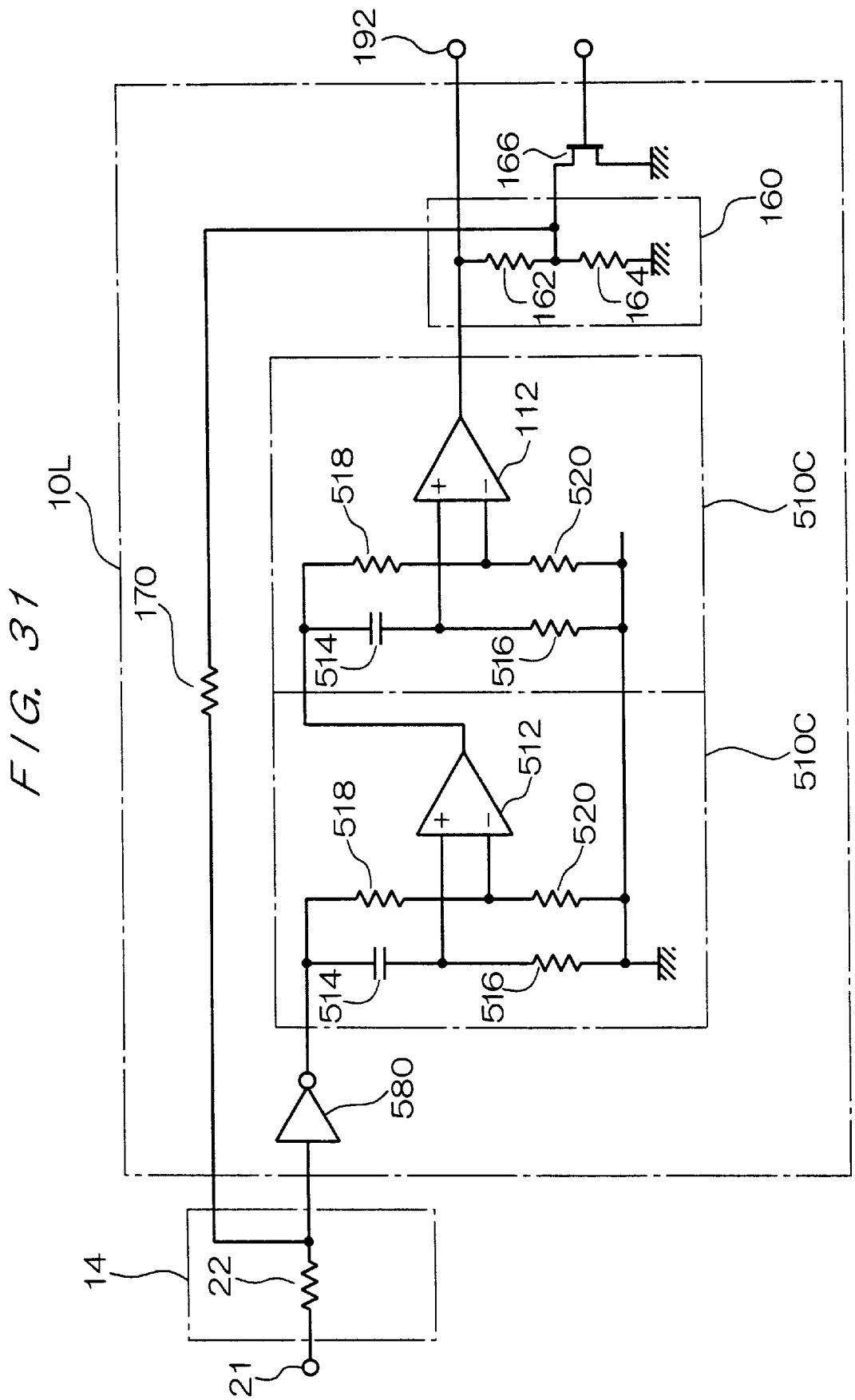
FIG. 31 is a circuit diagram showing a configuration of the oscillation circuit comprising two cascaded phase shifting circuits 510C.
Figure 32:
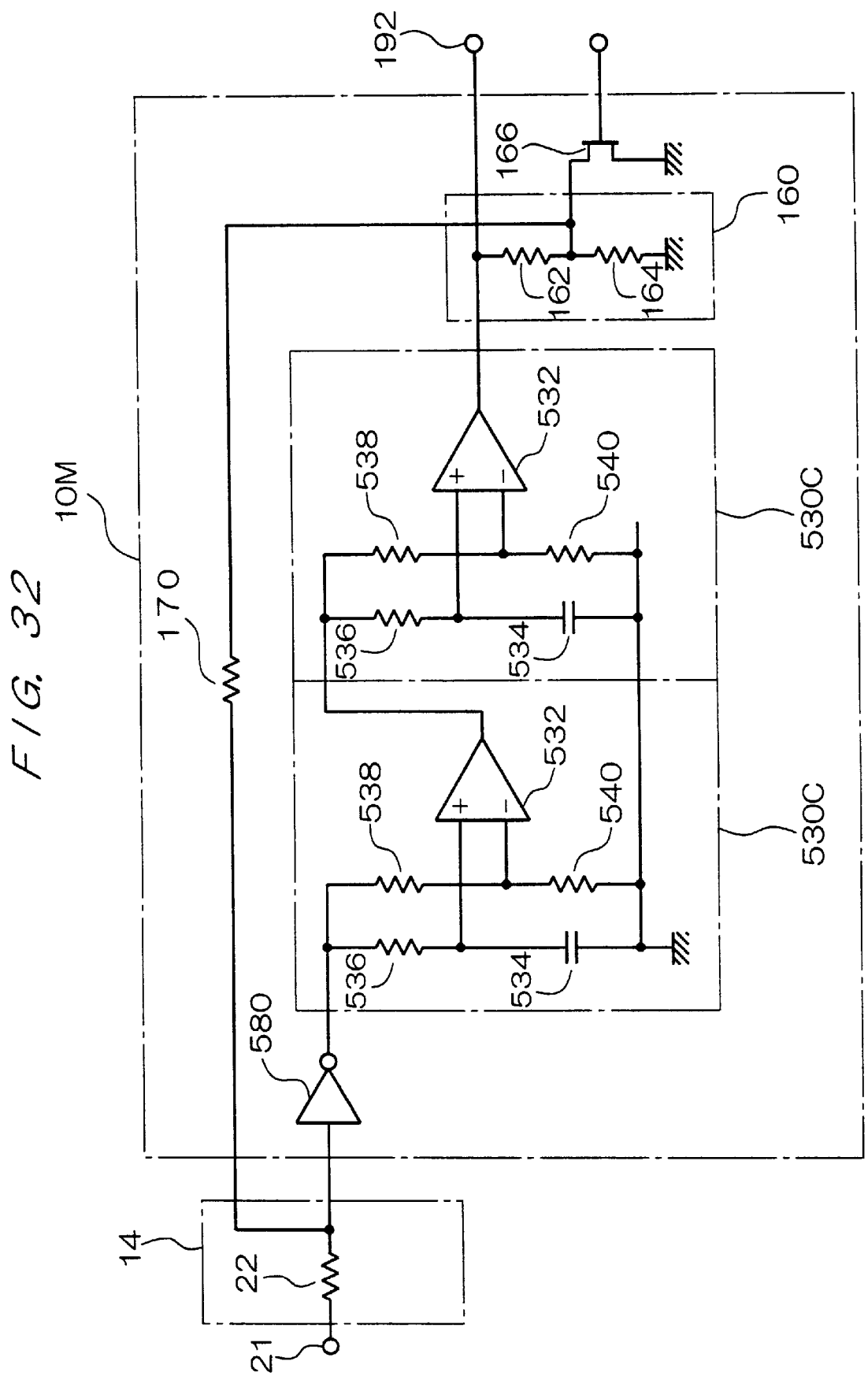
FIG. 32 is a circuit diagram showing a configuration of the oscillation circuit comprising two cascaded phase shifting circuits 530C.

FIG. 31 is a circuit diagram showing a fourteenth variant in the form of an oscillation circuit 10L comprising two cascaded phase shifting circuits 510C. FIG. 32 is a circuit diagram of an oscillation circuit 10M comprising two cascaded phase shifting circuits 530C.

The combined two phase shifting circuits 510C or the combined two phase shifting circuits 530C achieve a total of 180° phase shifting at a predetermined frequency, with a loop gain set to 1 or more through the regulation of the gain of at least one of the phase shifting circuits 510C, 530C and the phase inverting circuit 580, to thereby ensure a predetermined oscillating action.

Incidentally, the oscillation circuits 10K, 10L and 10M shown in FIGS. 28, 31 and 32, respectively, comprise two phase shifting circuits and a non-inverting circuit or two phase shifting circuits and a phase inverting circuit so that the combined three circuits achieve in cooperation a total of 360° phase shifting at a predetermined frequency to thereby ensure a predetermined oscillating action. Therefore, when attention is given to only the phase-shift amount, the order of connection of the three circuits has a certain degree of freedom, allowing the order of connection to be determined as needed.

It is to be noted that, in case of oscillation circuits 10L and 10M shown in FIGS. 31 and 32, respectively, the voltage dividing ratio of the voltage dividing circuit 160 is varied in response to a control voltage output from the AGC circuit 16. Instead, however, the amplification degree of at least one of the differential amplifiers 512, 532 and a phase inverting circuit 580 may be varied in response to the control voltage from the AGC circuit 16.

In the case of the oscillation circuit 10L and 10M shown in FIGS. 31, 32, an input signal is fed to the input circuit 14 disposed in front side of the anterior phase shifting circuit, although the point to feed the input signal is not limited to the front side of the anterior phase shifting circuit, but instead the input signal may be fed for example to the input circuit 14 interposed between the anterior phase shifting circuit and the posterior phase shifting circuit.

Although the oscillation circuits 10K, 10L and 10M shown in FIGS. 28, 31 and 32, respectively, comprise cascaded phase shifting circuits each including the CR circuit, at least one of the phase shifting circuits may include an LR circuit therewithin.

[Other Variants]

In case the various oscillation circuits illustrated in FIG. 13 and subsequent diagrams are used in the tuning amplifier 1 having the PLL configuration of FIG. 2, it will be sufficient for example that the resistor 116 included in the phase shifting circuit 110C, etc., is substituted by a variable resistor and that the resistance value of the variable resistor is varied depending on an output from the low pass filter 5 shown in FIG. 2. More specifically, the variable resistor is formed from a channel resistor of the FET so that the gate voltage of the FET is controlled in accordance with the output of the low pass filter 5 shown in FIG. 2. Alternatively, the resistor 136, etc., within the posterior phase shifting circuit 130C, etc., may be substituted by a variable resistor formed from the FET, with the resistor 116 remaining in the form of the fixed resistor.

Alternatively, the anterior and posterior phase shifting circuits may each include a variable resistor. This is advantageous in that a larger total amount of variation of the oscillation frequency, namely, a larger variable range of the oscillation frequency can be achieved due to the simultaneous variation of the phase-shift amount of the two phase shifting circuits.

The entire oscillation frequency may be varied by altering the capacitance of the capacitor 114, etc., with the resistance values of the resistors 116 and 136 remaining fixed. For example, the capacitor 114, etc., included in at least one of the two phase shifting circuits may be replaced by a variable capacitance element so that a variation of this capacitance can cause a variation of the phase-shift amount achieved by each phase shifting circuit to thereby vary the oscillation frequency. More specifically, the above variable capacitance element may be formed from a variable capacitance diode capable of varying a backward bias voltage applied to between the anode and the cathode or from an FET capable of varying a gate capacitance by the gate voltage. In order to vary the backward bias voltage applied to the variable capacitance element, a capacitor for blocking direct current has only to be connected in series to the variable capacitance element.

It is to be appreciated that there may be inverted the order of connection of the two phase shifting circuits constituting the various oscillation circuits shown in FIG. 13 and subsequent diagrams.

The various oscillation circuits shown in FIGS. 13 to 22 achieves a high stability through the use of the phase shifting circuit 110C, etc., using the operational amplifiers. However, differential amplifiers having a predetermined amplification degree may be used in place of the operational amplifiers within each phase shifting circuit since so high a performance is not required for the offset voltage or the voltage gain in a way of use of the phase shifting circuit 110C, etc., of this embodiment.

Figure 33:
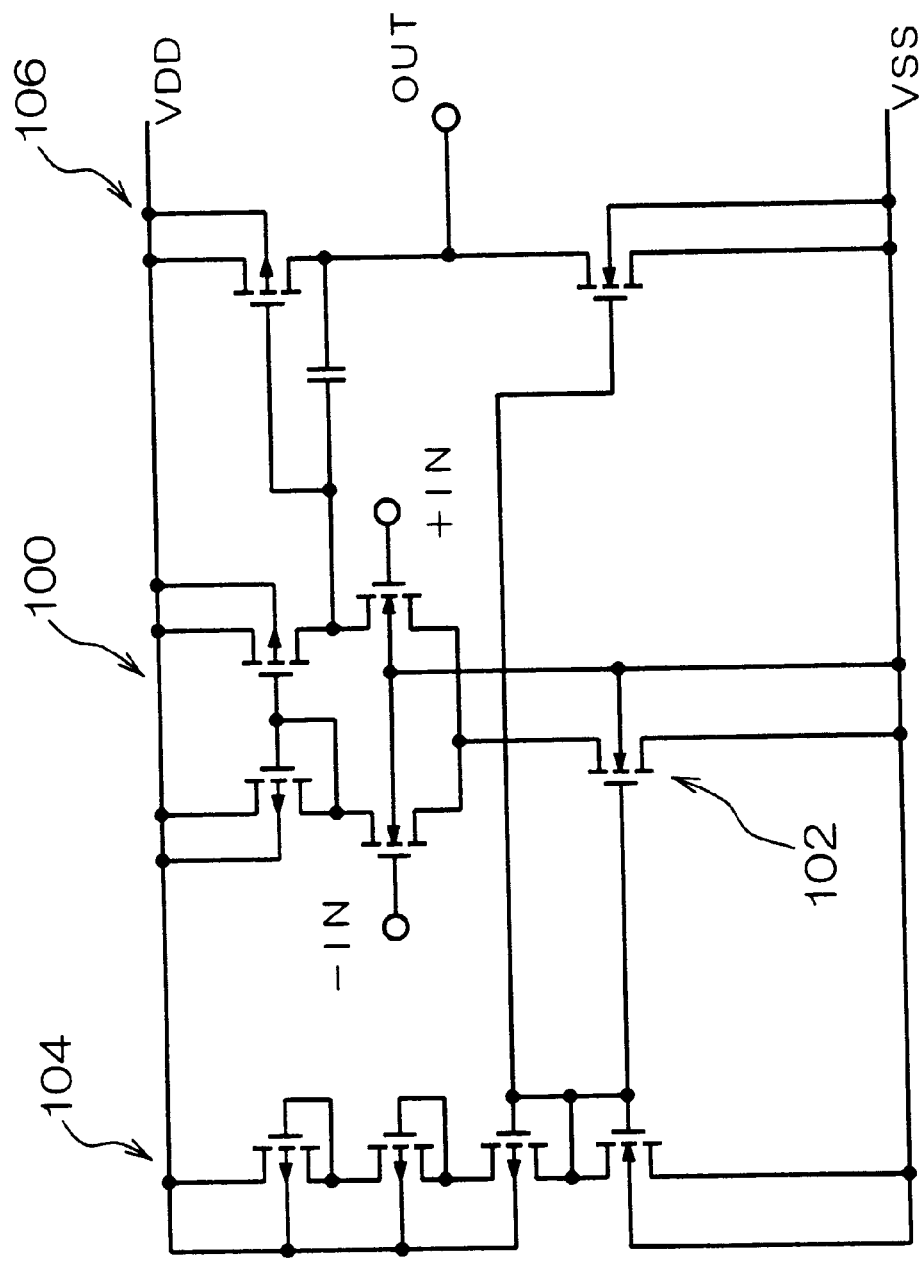
FIG. 33 is circuit diagram of a part necessary for the action of the phase shifting circuit, extracted from the configuration of the operational amplifier.

FIG. 33 is a circuit diagram of a part necessary for the action of the phase shifting circuit, extracted from the configuration of the operational amplifier, with its entirety acting as a differential amplifier having a predetermined amplification degree. The differential amplifier shown in the diagram includes a differential input stage 100 formed from an FET, a constant current circuit 102 for feeding a constant current to the differential input stage 100, a bias circuit 104 for applying a predetermined bias voltage to the constant current circuit 102, and an output amplifier 106 connected to the differential input stage 100. As is apparent from the diagram, a multi-stage amplifier circuit for a voltage gain included in the actual operational amplifier is excluded to simplify the configuration of the differential amplifier to achieve a broader band. Such a simplified circuit allows a rise of the upper limit of the operating frequency, so that there can be raised accordingly the upper limit of the oscillation frequency of the oscillation circuit 10A, etc., using this differential amplifier.

It is to be understood that the present invention is not restricted to the above embodiments and that various modifications can be made departing from the scope of the present invention.

For example, in the description of the PLL configuration shown in FIG. 2, the oscillation circuit 10 within the tuning amplifier 1 had an oscillation frequency variable depending on a control voltage. In case of using an oscillation circuit having an oscillation frequency variable depending on a control current, the control voltage has only to be converted into a control current.

Specific examples of the phase-shifting type oscillation circuit include in addition to the circuit shown in FIG. 3 a twin T type CR oscillation circuit, a positive-feedback applied bridged-T active BPF oscillation circuit, and a Wien bridge oscillation circuit.

INDUSTRIAL APPLICABILITY

According to the present invention as described hereinabove, upon the input of a signal to the oscillation circuit in oscillation mode, the oscillation output is drawn into a frequency of the input signal for a predetermined oscillating action. Due to a regulation of the output amplitude effected by a gain control circuit in particular, there occurs no variation in gain even when the tuning frequency has been altered by varying the oscillation frequency of the oscillation circuit. A regulation of the response speed of the gain control circuit enables the oscillating action to be performed in response to various input AC signals such as an AM modulated signal and an FM modulated signal. The signal amplitude can also be amplified simultaneously with the oscillating action.

By the employment of a PLL configuration including the above oscillation circuit in the form of a voltage controlled oscillation circuit, the oscillation frequency can easily be stabilized. In particular, the above oscillation circuit performs a predetermined oscillating action in the absence of input signals, so that the PLL control can be provided irrespective of the presence of the input signals.

What is claimed is:

1. A tuning amplifier comprising:
   an oscillation circuit for performing an oscillating action at a predetermined frequency, said oscillating circuit allowing its output to be fed back to its input side to form a closed loop;
   a gain control circuit for providing a control of an output amplitude of said oscillation circuit; and
   an input circuit for feeding an amplitude modulated signal to a part of said closed loop of said oscillation circuit, wherein
   said tuning amplifier extracts frequency components in the vicinity of an oscillation frequency of said oscillation circuit from signals fed by said input circuit so that amplification is made of amplitude modified components contained in signals having these frequency components.

2. A tuning amplifier comprising:
   an oscillation circuit for performing an oscillating action at a predetermined frequency, said oscillating circuit allowing its output to be fed back to its input side to form a closed loop;
   a gain control circuit for providing a control of an output amplitude of said oscillation circuit; and
   an input circuit for feeding an amplitude modulated signal to a part of said closed loop of said oscillation circuit, wherein
   said tuning amplifier extracts frequency components in the vicinity of an oscillation frequency of said oscillation circuit from signals fed by said input circuit so that amplification is made of amplitude modified components contained in signals having these frequency components, wherein said oscillation circuit is a voltage controlled oscillation circuit having an oscillation frequency defined in response to a control voltage, with a PLL configuration including said voltage controlled oscillation circuit being employed to stabilize a tuning frequency.

3. A tuning amplifier according to claim 1, wherein said oscillation circuit comprises an amplifier circuit and a feedback circuit, at least one of which has a frequency selective characteristic and which are connected to each other to form a loop, and wherein
   said oscillation circuit performs an oscillating action at a predetermined frequency defined depending on said frequency selective characteristic.

4. A tuning amplifier comprising:
   an oscillation circuit for performing an oscillating action at a predetermined frequency, said oscillating circuit allowing its output to be fed back to its input side to form a closed loop;
   a gain control circuit for providing a control of an output amplitude of said oscillation circuit; and
   an input circuit for feeding an amplitude modulated signal to a part of said closed loop of said oscillation circuit, wherein
   said tuning amplifier extracts frequency components in the vicinity of an oscillation frequency of said oscillation circuit from signals fed by said input circuit so that amplification is made of amplitude modified components contained in signals having these frequency components,
   wherein said oscillation circuit comprises an amplifier circuit and a feedback circuit, at least one of which has a frequency selective characteristic and which are connected to each other to form a loop, and wherein said oscillation circuit performs an oscillating action at a predetermined frequency defined depending on said frequency selective characteristic, and wherein when a frequency of a signal fed by said input circuit coincides with said predetermined frequency, said feedback circuit shifts the phase of this signal by 180°, and wherein said amplifier circuit inverts and amplifies a signal output from said feedback circuit for the output.

5. A tuning amplifier according to claim 4, wherein
   said feedback circuit comprises a plurality of cascaded low pass filters each including a resistor and a reactance element in the form of a capacitor or an inductor.

6. A tuning amplifier according to claim 4, wherein
   said feedback circuit comprises a plurality of cascaded high pass filters each including a resistor and a reactance element in the form of a capacitor or an inductor.

7. A tuning amplifier comprising:
   an oscillation circuit for performing an oscillating action at a predetermined frequency, said oscillating circuit allowing its output to be fed back to its input side to form a closed loop;
   gain control circuit for providing a control of an output amplitude of said oscillation circuit; and
   an input circuit for feeding an amplitude modulated signal to a part of said closed loop of said oscillation circuit, wherein
   said tuning amplifier extracts frequency components in the vicinity of an oscillation frequency of said oscillation circuit from signals fed by said input circuit so that amplification is made of amplitude modified components contained in signals having these frequency components,
   wherein said oscillation circuit comprises an amplifier circuit and a feedback circuit, at least one of which has a frequency selective characteristic and which are connected to each other to form a loop, and wherein said oscillation circuit performs an oscillating action at a predetermined frequency defined depending on said frequency selective characteristic, and wherein said amplifier circuit includes a CMOS inverter circuit.

8. A tuning amplifier according to claim 7, wherein said amplifier circuit has a first resistor connected in series to an input terminal of said inverter circuit and a second resistor interposed between said input terminal and an output terminal of said inverter circuit, with a resistance ratio between said first and second resistors being variable in response to an output from said gain control circuit.

9. A tuning amplifier comprising:
   an oscillation circuit for performing an oscillating action at a predetermined frequency, said oscillating circuit allowing its output to be fed back to its input side to form a closed loop;

a gain control circuit for providing a control of an output amplitude of said oscillation circuit; and an input circuit for feeding an amplitude modulated signal to a part of said closed loop of said oscillation circuit, wherein said tuning amplifier extracts frequency components in the vicinity of an oscillation frequency of said oscillation circuit from signals fed by said input circuit so that amplification is made of amplitude modified components contained in signals having these frequency components, wherein said oscillation circuit comprises two phase shifting circuits connected to each other to form a loop and including a differential amplifier, of which output is fed back to the input side, with an output of either of said two phase shifting circuits being provided as an oscillation signal for output.

10. A tuning amplifier according to claim 9, wherein at least one of said two cascaded phase shifting circuits includes a differential amplifier having an inverting input terminal to which is connected one end of a first resistor and receiving an AC signal by way of said first resistor, a second resistor interposed between said inverting input terminal of said differential amplifier and an output terminal thereof, and a series circuit connected to the other end of said first resistor and consisting of a third resistor and a reactance element in the form of a capacitor or an inductor, with a connection between said third resistor and said reactance element being connected to a non-inverting input terminal of said differential amplifier.

11. A tuning amplifier according to claim 9, wherein at least one of said two cascaded phase shifting circuits includes a differential amplifier having an inverting input terminal to which is connected one end of a first resistor and receiving an AC signal by way of said first resistor, a first voltage dividing circuit connected to an output terminal of said differential amplifier, a second resistor interposed between an output end of said first voltage dividing circuit and said inverting input terminal of said differential amplifier, and a series circuit connected to the other end of said first resistor and consisting of a third resistor and a reactance element in the form of a capacitor or an inductor, with a connection between said third resistor and said reactance element being connected to a non-inverting input terminal of said differential amplifier.

12. A tuning amplifier according to claim 9, wherein at least one of said two cascaded phase shifting circuits includes a differential amplifier having an inversion input terminal to which is connected one end of a first resistor and receiving an AC signal by way of said first resistor, a second resistor interposed between said inversion input terminal of said differential amplifier and an output terminal thereof, a third resistor having one end connected to said inversion input terminal of said differential amplifier and the other end connected to the ground, and a series circuit connected to the other end of said first resistor and consisting of a fourth resistor and a reactance element in the form of a capacitor or an inductor, with a connection between said fourth resistor and said reactance element being connected to a non-inversion input terminal of said differential amplifier.

13. A tuning amplifier according to claim 9, wherein said oscillation circuit comprises a non-inverting circuit for providing as its output an input AC signal without inverting its phase, said non-inverting circuit being inserted into a part of a closed loop formed by said two cascaded phase shifting circuits, and wherein said oscillation circuit performs an oscillating action at a frequency in the vicinity of a frequency allowing a total of 360° phase shifting to be achieved by the combination of said two cascaded phase shifting circuits.

14. A tuning amplifier according to claim 9, wherein said oscillation circuit comprises a phase inverting circuit for inverting an input AC signal for output, said phase inverting circuit being inserted into a part of a closed loop formed by said two cascaded phase shifting circuits, and wherein said oscillation circuit performs an oscillating action at a frequency in the vicinity of a frequency allowing a total of 180° phase shifting to be achieved by the combination of said two cascaded phase shifting circuits.

15. A tuning amplifier according to claim 9, further comprising:

a transistor based follower circuit interposed between said input circuit and said phase shifting circuit posterior to said input circuit.

16. A tuning amplifier according to claim 9, further comprising:

a second voltage dividing circuit inserted into a part of a closed loop formed by said two cascaded phase shifting circuits, wherein said oscillation circuit issues as its oscillation signal an AC signal fed to said second voltage dividing circuit.

17. A tuning amplifier comprising:

an oscillation circuit for performing an oscillating action at a predetermined frequency, said oscillating circuit allowing its output to be fed back to its input side to form a closed loop;

a gain control circuit for providing a control of an output amplitude of said oscillation circuit; and an input circuit for feeding an amplitude modulated signal to a part of said closed loop of said oscillation circuit, wherein said tuning amplifier extracts frequency components in the vicinity of an oscillation frequency of said oscillation circuit from signals fed by said input circuit so that amplification is made of amplitude modified components contained in signals having these frequency components, and wherein said oscillation circuit comprises two phase shifting circuits each including a series circuit consisting of a resistor and a reactance element in the form of a capacitor or an inductor, and a non-inverting circuit for amplifying an input AC signal without inverting its phase for output, and wherein said two phase shifting circuits and said non-inverting circuit are connected in a looped form, and wherein at least one of said two phase shifting circuits includes conversion means for converting input AC signals into in-phase and anti phase AC signals for output, and combining means for combining one AC signal by way of one end of said series circuit and the other AC signal by way of the other end of said series circuit.

18. A tuning amplifier according to claim 17, wherein said oscillation circuit performs an oscillating action at a frequency in the vicinity of a frequency allowing a total of 360° phase shifting to be achieved by the combination of said two cascaded phase shifting circuits.

19. A tuning amplifier according to claim 17, further comprising:

a voltage dividing circuit inserted into a part of a closed loop formed by said two phase shifting circuits and said non-inverting circuit which are cascaded, wherein said oscillation circuit issues as its oscillation signal an AC signal fed to said voltage dividing circuit.

20. A tuning amplifier according to claim 19, wherein a voltage dividing ratio of said voltage dividing circuit is regulated depending on an output from said gain control circuit so that an output amplitude of said oscillation circuit is kept at substantially a constant level.

21. A tuning amplifier according to claim 17, wherein a gain of said non-inverting circuit is regulated depending on an output from said gain control circuit so that an output amplitude of said oscillation circuit is kept at substantially a constant level.

22. A tuning amplifier comprising:

an oscillation circuit for performing an oscillating action at a predetermined frequency, said oscillating circuit allowing its output to be fed back to its input side to form a closed loop;

a gain control circuit for providing a control of an output amplitude of said oscillation circuit; and an input circuit for feeding an amplitude modulated signal to a part of said closed loop of said oscillation circuit, wherein said tuning amplifier extracts frequency components in the vicinity of an oscillation frequency of said oscillation circuit from signals fed by said input circuit so that amplification is made of amplitude modified components contained in signals having these frequency components, and wherein said oscillation circuit comprises two phase shifting circuits each including a series circuit consisting of a resistor and a reactance element in the form of a capacitor or an inductance, and a phase inverting circuit for inverting and amplifying an input AC signal for output, and wherein said two phase shifting circuits and said phase inverting circuit are connected in a looped form, and wherein at least one of said two phase shifting circuits includes conversion means for converting input AC signals into in-phase and anti phase AC signals for output, and combining means for combining one AC signal by way of one end of said series circuit and the other AC signal by way of the other end of said series circuit.

23. A tuning amplifier according to claim 22, wherein said oscillation circuit performs an oscillating action at a frequency in the vicinity of a frequency allowing a total of 180° phase shifting to be achieved by the combination of said two cascaded phase shifting circuits.

24. A tuning amplifier according to claim 22, further comprising:

a voltage dividing circuit inserted into a part of a closed loop formed by said two phase shifting circuits and said non-inverting circuit which are cascaded, wherein said oscillation circuit issues as its oscillation signal an AC signal fed to said voltage dividing circuit.

25. A tuning amplifier according to claim 24, wherein the voltage dividing ratio of said voltage dividing circuit is regulated depending on an output from said gain control circuit so that the output amplitude of said oscillation circuit is kept at substantially a constant level.

26. A tuning amplifier according to claim 22, wherein the gain of said phase inverting circuit is regulated depending on an output from said gain control circuit so that the output amplitude of said oscillation circuit is kept at substantially a constant level.

27. A tuning amplifier according to claim 9, wherein at least one of said two phase shifting circuits included in said oscillation circuit includes a first series circuit consisting of first and second resistors having substantially the same resistance value, a second series circuit consisting of a third resistance and a reactance element in the form of a capacitor or an inductor, and a differential amplifier for amplifying for output with a predetermined amplification degree a difference between a potential at a connection of said first and second resistors constituting said first series circuit and a potential at a connection of said third resistor and said reactance element constituting said second series circuit, with an AC signal being fed to one end of said first and second series circuits.

28. A tuning amplifier according to claim 27, wherein said oscillation circuit comprises a non-inverting circuit for providing as its output an input AC signal without inverting its phase, said non-inverting circuit being inserted into a part of a closed loop formed by said two cascaded phase shifting circuits, and wherein said oscillation circuit performs an oscillating action at a frequency in the vicinity of a frequency allowing a total of 360° phase shifting to be achieved by the combination of said two cascaded phase shifting circuits.

29. A tuning amplifier according to claim 27, wherein said oscillation circuit comprises a phase inverting circuit for inverting an input AC signal for output, said phase inverting circuit being inserted into a part of a closed loop formed by said two cascaded phase shifting circuits, and wherein said oscillation circuit performs an oscillating action at a frequency in the vicinity of a frequency allowing a total of 180° phase shifting to be achieved by the combination of said two cascaded phase shifting circuits.

30. A tuning amplifier according to claim 27, further comprising:

a voltage dividing circuit inserted into a part of a closed loop formed by said two cascaded phase shifting circuits, wherein said oscillation circuit issues as its oscillation signal an AC signal fed to said voltage dividing circuit.

31. A tuning amplifier according to claim 30, wherein the voltage dividing ratio of said voltage dividing circuit is regulated depending on an output from said gain control circuit so that the output amplitude of said oscillation circuit is kept at substantially a constant level.

32. A tuning amplifier according to claim 27, wherein the gain of said differential amplifier is regulated depending on an output from said gain control circuit so that the output amplitude of said oscillation circuit is kept at substantially a constant level.

33. A tuning amplifier according to claim 28, wherein the gain of said non-inverting circuit is regulated depending on an output from said gain control circuit so that the output amplitude of said oscillation circuit is kept at substantially a constant level.

34. A tuning amplifier according to claim 29, wherein the gain of said phase inverting circuit is regulated depending on an output from said gain control circuit so that the output amplitude of said oscillation circuit is kept at substantially a constant level.

* * * * *